(12) United States Patent
Kubota et al.

(10) Patent No.: US 11,524,383 B2
(45) Date of Patent: Dec. 13, 2022

(54) SUBSTRATE PROCESSING APPARATUS, SUBSTRATE PROCESSING METHOD, AND COMPUTER-READABLE RECORDING MEDIUM

(71) Applicant: Tokyo Electron Limited, Tokyo (JP)

(72) Inventors: Minoru Kubota, Kumamoto (JP); Hideharu Kyouda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/084,690

(22) PCT Filed: Dec. 6, 2016

(86) PCT No.: PCT/JP2016/086257
§ 371 (c)(1),
(2) Date: Sep. 13, 2018

(87) PCT Pub. No.: WO2017/158955
PCT Pub. Date: Sep. 21, 2017

(65) Prior Publication Data
US 2019/0084118 A1 Mar. 21, 2019

(30) Foreign Application Priority Data
Mar. 14, 2016 (JP) .............................. JP2016-049447

(51) Int. Cl.
*H01L 21/02* (2006.01)
*B24B 37/013* (2012.01)
(Continued)

(52) U.S. Cl.
CPC ........ *B24B 37/013* (2013.01); *H01L 21/0276* (2013.01); *H01L 21/31053* (2013.01);
(Continued)

(58) Field of Classification Search
None
See application file for complete search history.

(56) References Cited

U.S. PATENT DOCUMENTS 7,229,570 B2 * 6/2007 Taiji ........................ C09G 1/02
252/79.1
7,751,609 B1 * 7/2010 Berman .................. H01L 22/26
382/141
(Continued)

FOREIGN PATENT DOCUMENTS

JP 06-315850 A 11/1994
JP 09-150367 A 6/1997
(Continued)

OTHER PUBLICATIONS

International Search Report dated Feb. 21, 2017 for WO 2017/158955 A1.

*Primary Examiner* — Bradley Smith
(74) *Attorney, Agent, or Firm* — Venjuris, P.C.

(57) ABSTRACT

An end of polishing of a wafer is determined for each of wafers at a high accuracy. A wafer processing method includes: a first process of acquiring an initial state of a processing target surface of a wafer; a second process of forming a coating film on the wafer after the first process; a third process of polishing the processing target surface of the wafer by a polishing member based on initial polishing conditions in a state where the polishing member is in contact with the processing target surface of the wafer; a fourth process of acquiring a processed state of the processing target surface of the wafer after the third process; and a fifth process of determining an end of polishing, an insufficiency in polishing, or an excess in polishing based on the initial state and the processed state.

1 Claim, 14 Drawing Sheets

(51) Int. Cl.
*H01L 21/67* (2006.01)
*H01L 21/3105* (2006.01)
*H01L 21/027* (2006.01)
*H01L 21/66* (2006.01)

(52) U.S. Cl.
CPC .... *H01L 21/31058* (2013.01); *H01L 21/6715* (2013.01); *H01L 21/67178* (2013.01); *H01L 21/67219* (2013.01); *H01L 22/26* (2013.01); *H01L 22/12* (2013.01); *H01L 22/20* (2013.01)

(56) References Cited

U.S. PATENT DOCUMENTS

| | | | |
|---|---|---|---|
| 2012/0164917 A1* | 6/2012 | Kobata | B24B 37/205 451/6 |
| 2013/0344625 A1* | 12/2013 | Benvegnu | B24B 37/013 438/8 |
| 2018/0093360 A1* | 4/2018 | Shinozaki | B24B 37/10 |

FOREIGN PATENT DOCUMENTS

| | | |
|---|---|---|
| JP | 10-163139 A | 6/1998 |
| JP | 2004-22622 A | 1/2004 |

\* cited by examiner

US 11,524,383 B2

SUBSTRATE PROCESSING APPARATUS, SUBSTRATE PROCESSING METHOD, AND COMPUTER-READABLE RECORDING MEDIUM

CROSS REFERENCE TO RELATED APPLICATIONS

This application is a national phase of PCT application No. PCT/JP2016/086257, filed on 6 Dec. 2016, which claims priority from Japanese Patent Application No. 2016-049447, filed on 14 Mar. 2016, all of which are incorporated herein by reference.

TECHNICAL FIELD

The present disclosure relates to a substrate processing apparatus, a substrate processing method, and a computer-readable recording medium.

BACKGROUND

At present, in manufacturing a semiconductor device by finely processing a substrate (for example, a semiconductor wafer), a thin film may be formed on the wafer in some cases. Patent Documents 1 and 2 disclose a chemical mechanical polishing (CMP) device, as a technology of flattening a thin film. The chemical mechanical polishing device supplies a polishing liquid (slurry) to the front surface of a wafer that rotates while polishing the front surface by a polishing pad.

PRIOR ART DOCUMENT

Patent Document

Patent Document 1: Japanese Patent Laid-Open Publication No. 06-315850
Patent Document 2: Japanese Patent Laid-Open Publication No. 09-150367

SUMMARY OF THE INVENTION

Problem to be Solved

However, in Patent Documents 1 and 2, in polishing a plurality of substrates, for any of the substrates, the end of polishing on the substrate has been determined on the basis of the same reference value. Since a substrate state at the time of polishing is different for each of substrates, in this case, a variation occurs in the determination accuracy on the end of polishing. Thus, a variation may occur in the performance among manufactured semiconductor devices.

Therefore, the present disclosure describes a substrate processing apparatus, a substrate processing method, and a computer-readable recording medium by which the end of polishing on a substrate may be highly accurately determined for each substrate.

Means to Solve the Problem

According to one aspect of the present disclosure, a substrate processing apparatus includes: a film forming unit configured to form a film on a processing target surface of a substrate; a state acquisition unit configured to acquire a state of the processing target surface of the substrate; a polishing member configured to come in contact with the processing target surface of the substrate and to polish the processing target surface; a driving unit configured to drive the polishing member; and a controller. The controller executes: a first processing of controlling the state acquisition unit to acquire an initial state of the processing target surface of the substrate; a second processing of controlling the film forming unit, after the first processing, to form a film on the processing target surface of the substrate; a third processing of controlling the driving unit to polish the processing target surface of the substrate by the polishing member based on initial polishing conditions; a fourth processing of controlling the state acquisition unit, after the third processing, to acquire a processed state of the processing target surface of the substrate; and a fifth processing of determining an end of polishing, an insufficiency in polishing, or an excess in polishing based on the initial state and the processed state.

In the substrate processing apparatus according to one aspect of the present disclosure, the controller executes the first processing of controlling the state acquisition unit to acquire the initial state of the processing target surface of the substrate, the fourth processing of controlling the state acquisition unit to acquire a processed state of the processing target surface of the substrate after the third processing of polishing the processing target surface of the substrate by the polishing member based on the initial conditions, and the fifth processing of determining the end of polishing, the insufficiency in polishing, or the excess in polishing based on the initial state and the processed state. Thus, the initial state of the processing target surface of the substrate functions as a reference value by which the end of polishing, the insufficiency in polishing, or the excess in polishing is determined. Therefore, there is no need to process a plurality of sample substrates in advance in order to obtain a reference value and thus, it is possible to immediately obtain the reference value without wasting the sample substrates. The state of the processing target surface of the substrate is different for each of substrates. However, since the initial state of the processing target surface is acquired for each of the substrates, the end of polishing may be highly accurately determined for each of the substrates. In this manner, in the substrate processing apparatus according to one aspect of the present disclosure, it becomes possible to rapidly perform a determination of the end of polishing of the substrate, for each of the substrates, at a low cost and a high accuracy.

The substrate processing apparatus according to one aspect of the present disclosure may further include an additive liquid supply unit configured to supply an additive liquid to the processing target surface of the substrate. A holding unit may be configured to hold and rotate the substrate, and the film forming unit may be configured to supply a coating liquid to the processing target surface of the substrate. The controller may control, in the second processing, after the first processing, the holding unit and the film forming unit to rotate the substrate and to supply the coating liquid to the processing target surface of the substrate so that a coating film may be formed on the substrate, and may control, in the third processing, after a solvent included in the coating film is volatilized and the coating film becomes a semi-solidified film, the holding unit, the driving unit, and the additive liquid supply unit to supply the additive liquid to the processing target surface of the substrate that rotates to make a state where the polishing member and the processing target surface of the substrate are wet with the additive liquid so that one of the polishing member and the substrate may be relatively moved with respect to the other and the processing target surface of the substrate may be polished by the polishing member based on the initial polishing conditions. In this case, when the semi-solidified film is polished by the polishing member, since a state is made in which the polishing member and the processing target surface of the substrate are wet with the additive liquid, the processing target surface of the substrate is hardly damaged. Accordingly, the processing target surface of the substrate is polished without performing a chemical mechanical polishing processing that polishes a cured film by using a polishing liquid in a large amount. As a result, it becomes possible to flatten the processing target surface of the substrate at a low cost.

An uneven pattern may be formed on a front surface of the substrate, and the processing target surface may be an outermost surface of the substrate on an uneven surface side. In this case as well, when the semi-solidified film is polished by the polishing member, since a state is made in which the polishing member and the processing target surface of the substrate are wet with the additive liquid, a damage may be suppressed from occurring in the uneven pattern of the substrate.

The polishing member may be made of polyvinyl alcohol or polyethylene. In this case, the semi-solidified film in a soft state to some extent before the coating film is completely hardened is polished by the polishing member made of polyvinyl alcohol or polyethylene. Accordingly, a damage may be further suppressed from occurring in the uneven pattern of the substrate.

The polishing member may be a porous body. In this case, since the water absorption of the polishing member increases, the additive liquid is absorbed by the polishing member in the third processing. Therefore, as the additive liquid soaking into the polishing member seeps into the processing target surface of the substrate, the processing target surface of the substrate is polished by the polishing member. As a result, at the time of polishing by the polishing member, a damage may be further suppressed from occurring in the uneven pattern of the substrate.

As a result of determination in the fifth processing, when the processing target surface of the substrate is insufficiently polished, the controller may further execute a sixth processing of controlling the driving unit to polish the processing target surface of the substrate by the polishing member based on additional polishing conditions different from the initial polishing conditions. When the polishing is insufficient in the processing target surface of the substrate, polishing of the substrate is performed again based on the additional polishing conditions different from the initial polishing conditions. Thus, it becomes possible to more accurately flatten the processing target surface of the substrate.

As a result of determination in the fifth processing, when the processing target surface of the substrate is excessively polished, the controller may further execute a seventh processing of controlling the film forming unit to form another film on the processing target surface of a same substrate as the substrate processed in the third processing by the polishing member, and an eighth processing of controlling the driving unit after the seventh processing, to polish the processing target surface of the substrate by the polishing member based on re-polishing conditions different from the initial polishing conditions. When the polishing is excessive in the processing target surface of the substrate, after another film is formed on the processing target surface of the substrate, polishing of the substrate is performed again based on the re-polishing conditions different from the initial polishing conditions. Thus, it becomes possible to more accurately flatten the processing target surface of the substrate.

As a result of determination in the fifth processing, when the processing target surface of the substrate is insufficiently polished or excessively polished, in executing the first to fifth processings on another subsequent substrate, the controller may polish a processing target surface of the other substrate by the polishing member based on new initial polishing conditions different from the initial polishing conditions, in the third processing. In this case, it becomes possible to more accurately flatten the processing target surface of the subsequent substrate.

The state acquisition unit may be a camera configured to capture the processing target surface of the substrate and to acquire a capture image of the processing target surface, and the controller may determine the end of polishing, the insufficiency in polishing, or the excess in polishing in the fifth processing, by comparing capture images acquired by the state acquisition unit in the first and fourth processings, respectively, to each other.

The controller may further execute a ninth processing of controlling the state acquisition unit after the second processing and before the third processing, to acquire an intermediate state of the processing target surface of the substrate, and may determine the end of polishing, the insufficiency in polishing, or the excess in polishing in the fifth processing, based on the initial state, the intermediate state, and the processed state. In this case, the end of polishing, the insufficiency in polishing, or the excess in polishing may be more accurately determined based on three states (the initial state, the intermediate state, and the processed state).

The state acquisition unit may be a sensor configured to acquire a physical quantity that changes according to a progress of polishing on the processing target surface of the substrate, and the controller may determine the end of polishing, the insufficiency in polishing, or the excess in polishing in the fifth processing, by comparing physical quantities acquired by the state acquisition unit in the first, fourth, and ninth processings, respectively, to each other.

According to another aspect of the present disclosure, a substrate processing method includes: a first process of acquiring an initial state of a processing target surface of a substrate; a second process of forming a film on the substrate after the first process; a third process of polishing the processing target surface of the substrate by a polishing member based on initial polishing conditions in a state where the polishing member is in contact with the processing target surface of the substrate; a fourth process of acquiring a processed state of the processing target surface of the substrate after the third process; and a fifth process of determining an end of polishing, an insufficiency in polishing, or an excess in polishing based on the initial state and the processed state.

In the substrate processing method according to another aspect of the present disclosure, in the first process, the initial state of the processing target surface of the substrate is acquired, in the fourth process after the third process, the processed state of the processing target surface of the substrate is acquired, and in the fifth process, the end of polishing, the insufficiency in polishing, or the excess in polishing is determined based on the initial state and the processed state. Thus, the initial state of the processing target surface of the substrate functions as a reference value by which the end of polishing, the insufficiency in polishing, or the excess in polishing is determined. Therefore, there is no need to process a plurality of sample substrates in advance in order to obtain a reference value and thus, it is possible to immediately obtain the reference value without wasting the sample substrates. The state of the processing target surface of the substrate is different for each of substrates. However, since the initial state of the processing target surface is acquired for each of the substrates, the end of polishing may be highly accurately determined for each of the substrates. In this manner, in the substrate processing method according to another aspect of the present disclosure, it becomes possible to rapidly perform a determination of the end of polishing of the substrate, for each of the substrates, at a low cost and a high accuracy.

In the second process, the substrate may be rotated and a coating liquid may be supplied to the processing target surface of the substrate so that a coating film may be formed on the substrate, and in the third process, after a solvent included in the coating film is volatilized and the coating film becomes a semi-solidified film, an additive liquid may be supplied to the processing target surface of the substrate that rotates to make a state where the polishing member and the processing target surface of the substrate are wet with the additive liquid, and the processing target surface of the substrate may be polished by the polishing member based on the initial polishing conditions in a state where the polishing member is in contact with the processing target surface of the substrate. In this case, when the semi-solidified film is polished by the polishing member, since a state is made in which the polishing member and the processing target surface of the substrate are wet with the additive liquid, the processing target surface of the substrate is hardly damaged. Accordingly, the processing target surface of the substrate is polished without performing a chemical mechanical polishing processing that polishes a cured film by using a polishing liquid in a large amount. As a result, it becomes possible to flatten the processing target surface of the substrate at a low cost.

An uneven pattern may be formed on a front surface of the substrate, and the processing target surface may be an outermost surface of the substrate on an uneven surface side. In this case as well, when the semi-solidified film is polished by the polishing member, since a state is made in which the polishing member and the processing target surface of the substrate are wet with the additive liquid, a damage may be suppressed from occurring in the uneven pattern of the substrate.

The polishing member may be made of polyvinyl alcohol or polyethylene. In this case, the semi-solidified film in a soft state to some extent before the coating film is completely hardened is polished by the polishing member made of polyvinyl alcohol or polyethylene. Accordingly, a damage may be further suppressed from occurring in the uneven pattern of the substrate.

The polishing member may be a porous body. In this case, since the water absorption of the polishing member increases, the additive liquid is absorbed by the polishing member in the third process. Therefore, as the additive liquid soaking into the polishing member seeps into the processing target surface of the substrate, the processing target surface of the substrate is polished by the polishing member. As a result, at the time of polishing by the polishing member, a damage may be further suppressed from occurring in the uneven pattern of the substrate.

The substrate processing method according to another aspect of the present disclosure may further include a sixth process of polishing the processing target surface of the substrate by the polishing member based on additional polishing conditions different from the initial polishing conditions when, as a result of determination in the fifth process, the processing target surface of the substrate is insufficiently polished. When the polishing is insufficient in the processing target surface of the substrate, polishing of the substrate is performed again based on the additional polishing conditions different from the initial polishing conditions. Thus, it becomes possible to more accurately flatten the processing target surface of the substrate.

The substrate processing method according to another aspect of the present disclosure may further include a seventh process of forming another film on the processing target surface of a same substrate as the substrate processed in the third process by the polishing member, and an eighth process of polishing the processing target surface of the substrate by the polishing member based on re-polishing conditions different from the initial polishing conditions after the seventh process when, as a result of determination in the fifth process, the processing target surface of the substrate is excessively polished. When the polishing is excessive in the processing target surface of the substrate, after another film is formed on the processing target surface of the substrate, polishing of the substrate is performed again based on the re-polishing conditions different from the initial polishing conditions. Thus, it becomes possible to more accurately flatten the processing target surface of the substrate.

As a result of determination in the fifth process, when the processing target surface of the substrate is insufficiently polished or excessively polished, in processing of another subsequent substrate in the first to fifth processes, in the third process, a processing target surface of the other substrate may be polished by the polishing member based on new initial polishing conditions different from the initial polishing conditions. In this case, it becomes possible to more accurately flatten the processing target surface of the subsequent substrate.

In the first process, the processing target surface of the substrate may be captured and a capture image of the processing target surface may be acquired as the initial state, in the fourth process, the processing target surface of the substrate may be captured and a capture image of the processing target surface may be acquired as the processed state, and in the fifth process, the capture images acquired in the first and fourth processes, respectively, may be compared to each other so as to determine the end of polishing, the insufficiency in polishing, or the excess in polishing.

The substrate processing method according to another aspect of the present disclosure may further include a ninth process of acquiring an intermediate state of the processing target surface of the substrate after the second process and before the third process. In the fifth process, the end of polishing, the insufficiency in polishing, or the excess in polishing may be determined based on the initial state, the intermediate state, and the processed state. In this case, the end of polishing, the insufficiency in polishing, or the excess in polishing may be more accurately determined based on three states (the initial state, the intermediate state, and the processed state).

In the first, ninth, and fourth processes, a physical quantity that changes according to a progress of polishing on the processing target surface of the substrate may be acquired as each of the initial state, the intermediate state, and the processed state, and in the fifth process, physical quantities acquired in the first, fourth, and ninth processes, respectively may be compared to each other so as to determine the end of polishing, the insufficiency in polishing, or the excess in polishing.

According to a further aspect of the present disclosure, a computer-readable recording medium has stored therein a program for causing a substrate processing apparatus to execute the above described substrate processing method. In the computer-readable recording medium according to a further aspect of the present disclosure, as in the above described substrate processing method, it becomes possible to rapidly perform a determination of the end of polishing of the substrate, for each of substrates, at a low cost and a high accuracy. In the present specification, the computer-readable recording medium includes a non-transitory-type medium (non-transitory computer recording medium) (for example, various types of main storage devices or auxiliary storage devices), or a propagation signal (transitory computer recording medium) (for example, a data signal that may be provided via a network).

Effect of the Invention

According to the substrate processing apparatus, the substrate processing method, and the computer-readable recording medium according to the present disclosure, it becomes possible to determine the end of polishing of a substrate, for each of substrates, at a high accuracy.

DETAILED DESCRIPTION TO EXECUTE THE INVENTION

Figure 1:
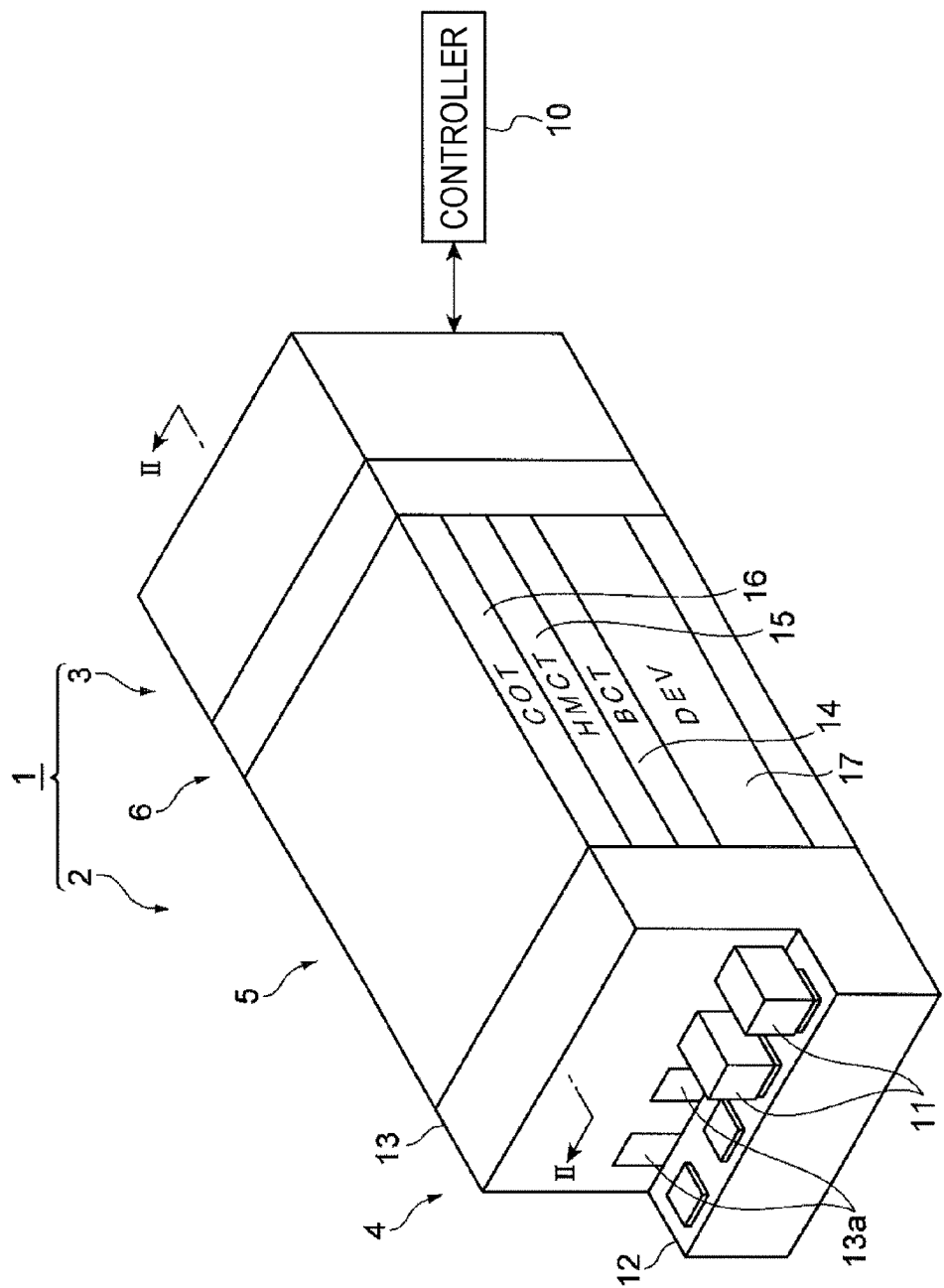
FIG. 1 is a perspective view illustrating a substrate processing system.

The exemplary embodiment according to the present disclosure as described below is an example for explaining the present invention, and thus, the present invention is not limited to the following contents. In the following description, the same elements or elements having the same functions use the same reference numerals, and thus redundant descriptions thereof will be omitted.

[Substrate Processing System]

As illustrated in FIG. 1, a substrate processing system 1 (a substrate processing apparatus) includes a coating and developing apparatus 2 (a substrate processing apparatus), an exposure apparatus 3, and a controller 10 (a controller). The exposure apparatus 3 performs an exposure processing (pattern exposure) on a photosensitive resist film formed on a front surface Wa (see, e.g., FIG. 5) of a wafer W (a substrate). Specifically, an exposure target portion of a photosensitive resist film (a photosensitive film) is selectively irradiated with energy rays by a method such as, for example, immersion exposure. As for the energy rays, for example, an ArF excimer laser, a KrF excimer laser, a g-line, an i-line or an extreme ultraviolet (EUV) may be exemplified.

The coating and developing apparatus 2 performs a processing of forming a photosensitive resist film or a non-photosensitive resist film on the front surface Wa of the wafer W before the exposure processing by the exposure apparatus 3. The coating and developing apparatus 2 performs a development processing of the photosensitive resist film after the exposure processing on the photosensitive resist film by the exposure apparatus 3.

The wafer W may take a disc shape, or a circular shape, a portion of which is cut out, or may take a shape other than a circle such as, for example, a rectangle or a polygon. In the present exemplary embodiment, as for the wafer W, a rectangular substrate having a rectangular shape will be described as an example. The wafer W may be, for example, a semiconductor substrate, a glass substrate, a mask substrate, a flat panel display (FPD) substrate, or other various substrates. The mask substrate is used as, for example, a reticle of the exposure apparatus 3. The diameter of the wafer W may range from, for example, about 200 mm to 450 mm. In the present exemplary embodiment, an uneven pattern P (see, e.g., FIG. 5) is formed on the front surface Wa of the wafer W. Thus, the front surface Wa of the wafer W is an uneven surface.

As illustrated in FIGS. 1 to 4, the coating and developing apparatus 2 includes a carrier block 4, a processing block 5, and an interface block 6. The carrier block 4, the processing block 5, and the interface block 6 are aligned in the horizontal direction.

Figure 3:
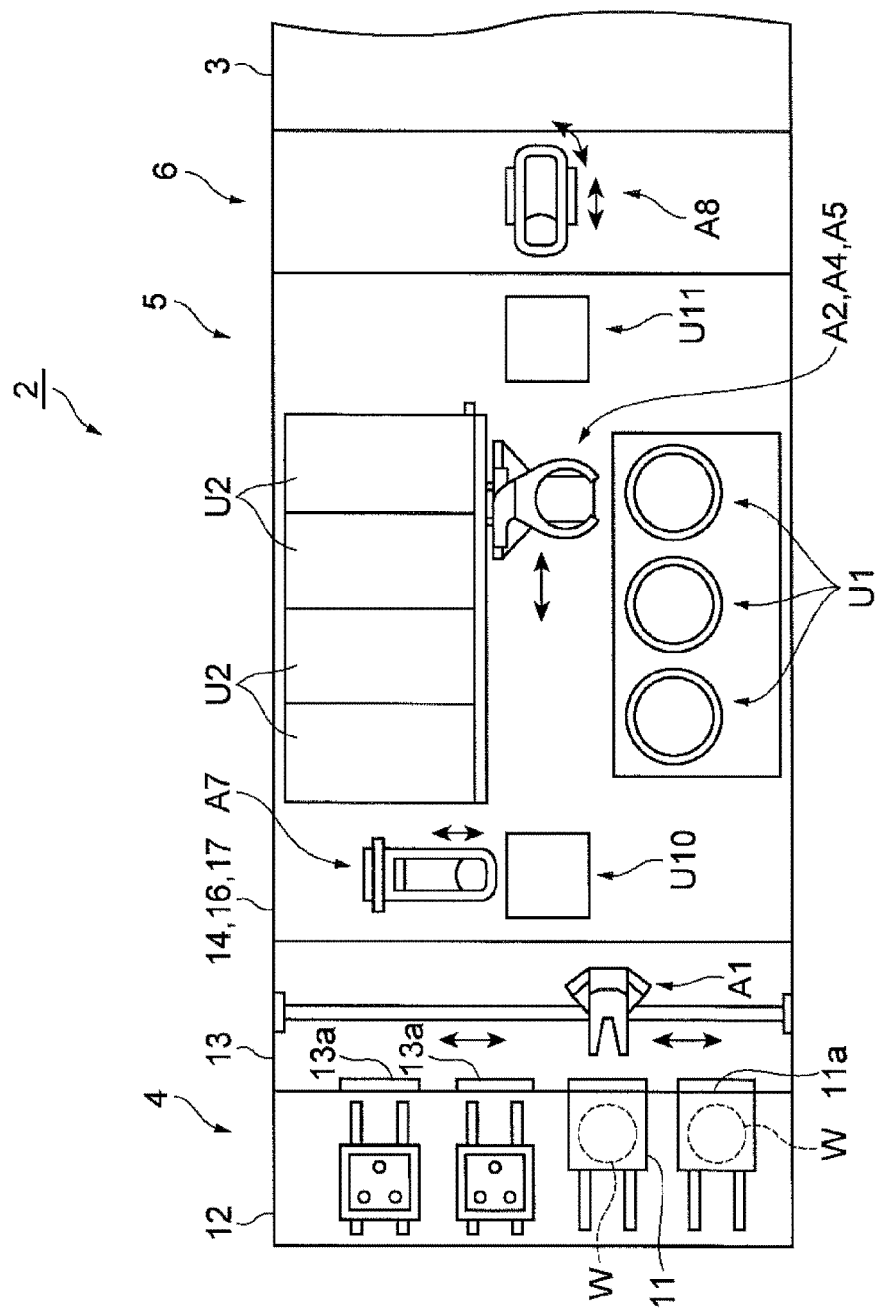
FIG. 3 is a plan view illustrating processing modules (a BCT module, a COT module, and a DEV module).
Figure 4:
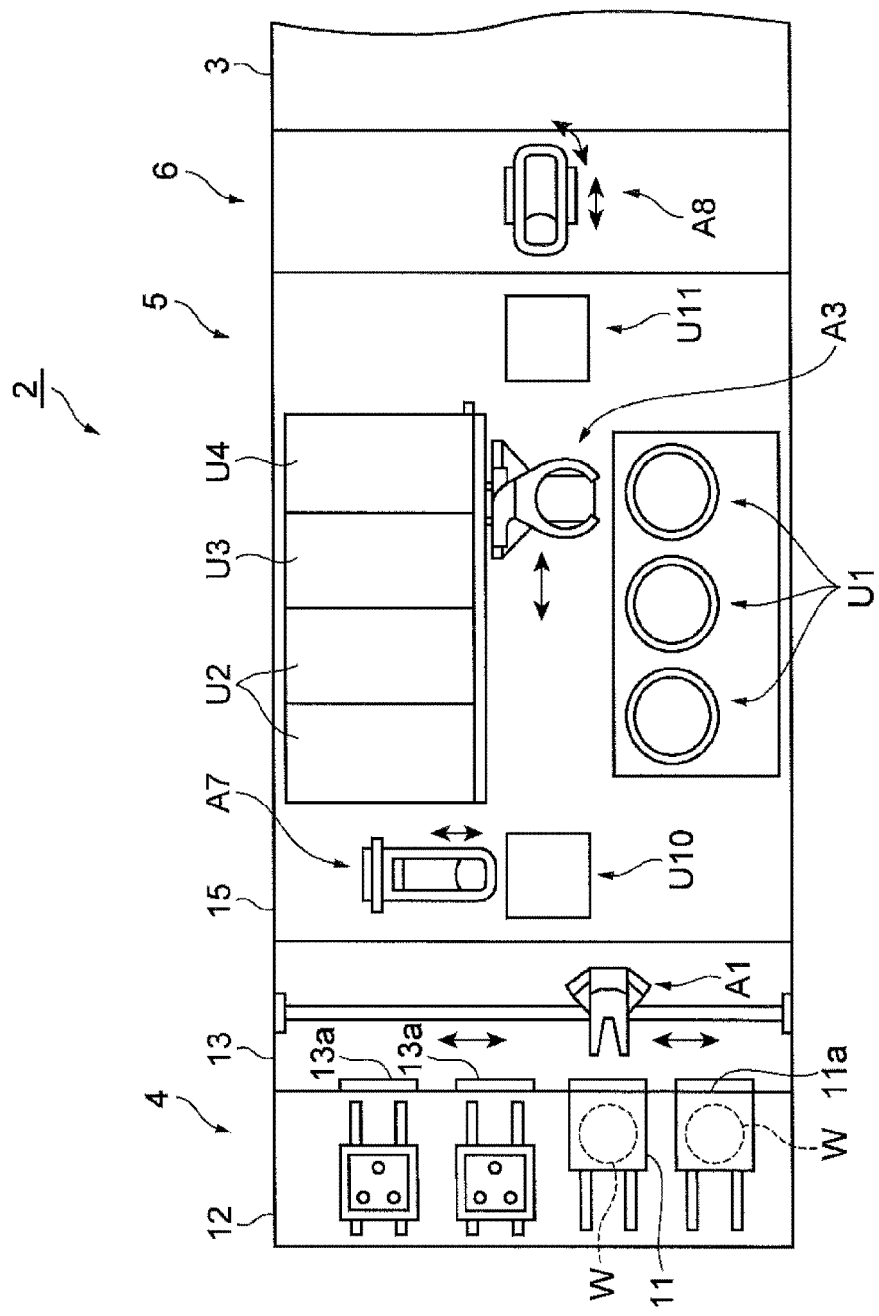
FIG. 4 is a plan view illustrating a processing module (an HMCT module).

The carrier block 4, as illustrated in FIG. 1, FIG. 3 and FIG. 4, includes a carrier station 12 and a carry-in/out section 13. The carrier station 12 supports a plurality of carriers 11. The carrier 11 accommodates at least one wafer W in a sealed state. An open/close door (not illustrated) through which the wafer W is loaded/unloaded is provided on a side surface 11a of the carrier 11. The carrier 11 is detachably provided on the carrier station 12 such that the side surface 11a faces the carry-in/out section 13 side.

The carry-in/out section 13 is located between the carrier station 12 and the processing block 5. The carry-in/out section 13 includes a plurality of open/close doors 13a. When the carrier 11 is placed on the carrier station 12, a state is made in which the open/close door of the carrier 11 faces the open/close door 13a. By opening the open/close door 13a and the open/close door of the side surface 11a at the same time, the inside of the carrier 11 is communicated with the inside of the carry-in/out section 13. The carry-in/out section 13 incorporates a delivery arm A1. By the delivery arm A1, a wafer W is taken out of the carrier 11 and delivered to the processing block 5, and the wafer W is received from the processing block 5 and is returned into the carrier 11.

Figure 2:
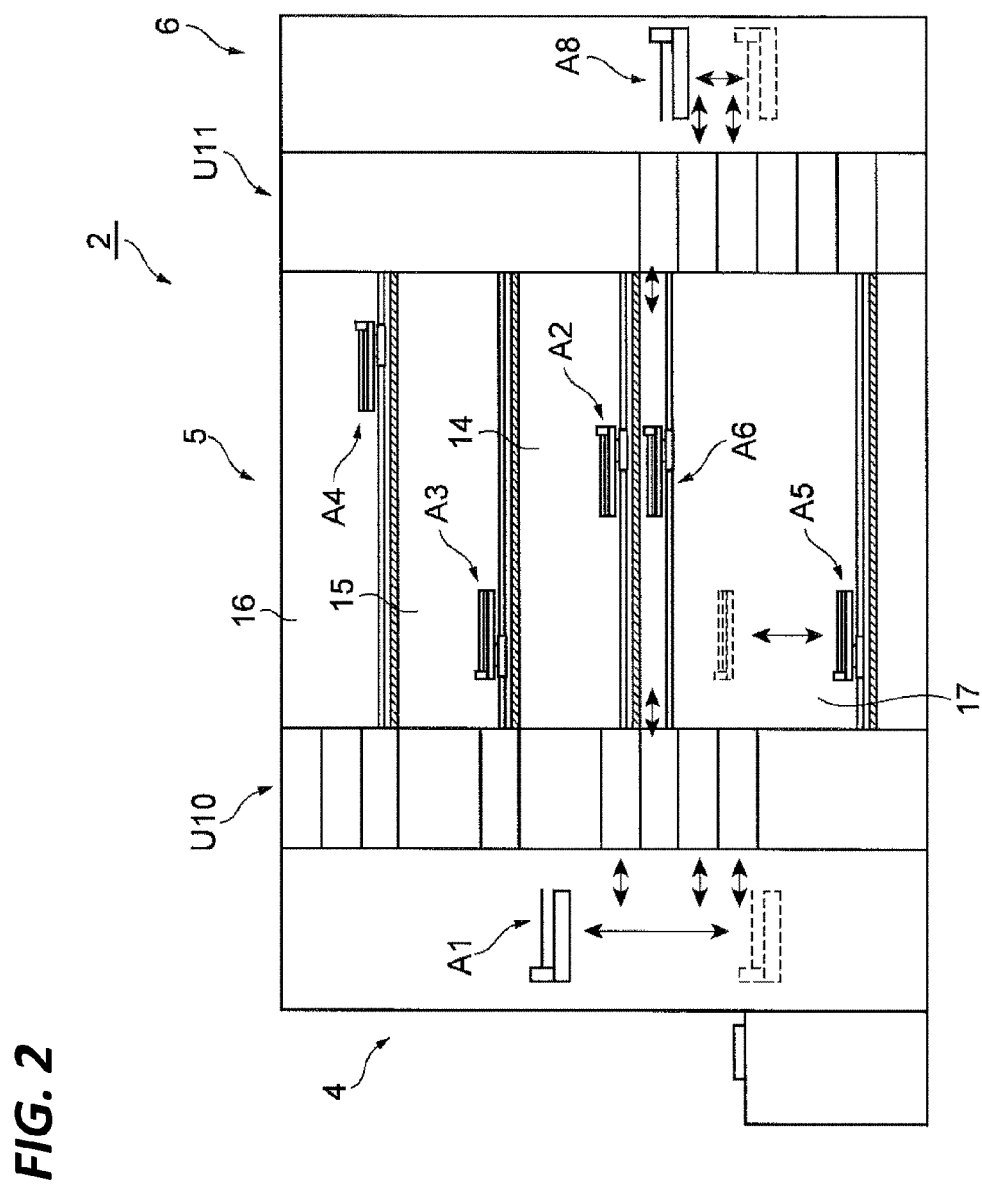
FIG. 2 is a sectional view taken along the line II-II of FIG. 1.

The processing block 5, as illustrated in FIG. 1 and FIG. 2, includes processing modules 14 to 17. The processing modules 14 to 17 are aligned in the order of the processing module 17, the processing module 14, the processing module 15, and the processing module 16 from the bottom surface side. Each of the processing modules 14, 16, and 17, as illustrated in FIG. 3, includes a liquid processing unit U1 and a heat treatment unit U2. The processing module 15, as illustrated in FIG. 4, includes the liquid processing unit U1 (a substrate processing apparatus), the heat treatment unit U2, an inspection unit U3 (a substrate processing apparatus), and a polishing unit U4 (a substrate processing apparatus).

The liquid processing unit U1 is configured to supply various types of processing liquids to the front surface Wa of a wafer W (details will be described below). The heat treatment unit U2 is configured to perform a heat treatment by heating the wafer W by, for example, a hot plate, and cooling the heated wafer W by, for example, a cooling plate. The inspection unit U3 is configured to capture the front surface Wa of the wafer W (details will be described below). The polishing unit U4 is configured to polish a processing target surface on the front surface Wa (uneven surface) side of the wafer W.

The processing module 14 is an underlayer film forming module (BCT module) configured to form an underlayer film on the front surface Wa of a wafer W. The processing module 14 incorporates a conveyance arm A2 that conveys the wafer W to each of the units U1 and U2 (see FIG. 2 and FIG. 3). The liquid processing unit U1 of the processing module 14 applies a coating liquid for forming an underlayer film to the front surface Wa of the wafer W to form a coating film. The heat treatment unit U2 of the processing module 14 performs various types of heat treatments accompanying the formation of the underlayer film. As for a specific example of the heat treatment, a bake treatment for curing the coating film to form the underlayer film may be exemplified. As for the underlayer film, for example, an anti-reflection (SiARC) film may be exemplified.

The processing module 15 is an intermediate film (hard mask) forming module (HMCT module) configured to form an intermediate film on the underlayer film. The processing module 15 incorporates a conveyance arm A3 that conveys the wafer W to each of the units U1 to U4 (see FIG. 2 and FIG. 4). The liquid processing unit U1 of the processing module 15 applies a coating liquid for forming an intermediate film, on the underlayer film to form a coating film. The heat treatment unit U2 of the processing module 15 performs various types of heat treatments accompanying the formation of the intermediate film. As for a specific example of the heat treatment, a bake treatment for curing the coating film to form the intermediate film may be exemplified. As for the intermediate film, for example, a spin on carbon (SOC) film, and an amorphous carbon film may be exemplified.

The processing module 16 is a resist film forming module (COT module) configured to form a thermosetting resist film on the intermediate film. The processing module 16 incorporates a conveyance arm A4 that conveys the wafer W to each of the units U1 and U2 (see FIG. 2 and FIG. 4). The liquid processing unit U1 of the processing module 16 applies a coating liquid (resist liquid) for forming a resist film, on the intermediate film to form a coating film. The heat treatment unit U2 of the processing module 16 performs various types of heat treatments accompanying the formation of the resist film. As for a specific example of the heat treatment, a bake treatment (PAB: Pre Applied Bake) for curing the coating film to form the resist film may be exemplified.

The processing module 17 is a development processing module (DEV module) configured to perform a development processing of an exposed resist film. The processing module 17 incorporates a conveyance arm A5 that conveys the wafer W to each of the units U1 and U2, and a direct conveyance arm A6 that conveys the wafer W without passing through these units (see FIG. 2 and FIG. 3). A developing unit of the processing module 17 supplies a developer to an exposed resist film to develop the resist film. The liquid processing unit U1 of the processing module 17 supplies a rinsing liquid to the developed resist film to wash out dissolved components of the resist film together with the developer. Accordingly, the resist film is partially removed, and a resist pattern is formed. The heat treatment unit U2 of the processing module 17 performs various types of heat treatments accompanying the development processing. As for a specific example of the heat treatment, for example, a bake treatment (PEB: Post Exposure Bake) before a development processing, and a bake treatment (PB: Post Bake) after a development processing may be exemplified.

A shelf unit U10 is provided on the carrier block 4 side within the processing block 5, as illustrated in FIG. 2 and FIG. 3. The shelf unit U10 is provided over the processing module 15 from the bottom surface, and is partitioned into a plurality of cells aligned in the vertical direction. A lifting arm A7 is provided in the vicinity of the shelf unit U10. The lifting arm A7 moves up and down a wafer W among the cells of the shelf unit U10.

A shelf unit U11 is provided on the interface block 6 side within the processing block 5. The shelf unit U11 is provided over the top portion of the processing module 17 from the bottom surface, and is partitioned into a plurality of cells aligned in the vertical direction.

The interface block 6 incorporates a delivery arm A8, and is connected to the exposure apparatus 3. By the delivery arm A8, a wafer W on the shelf unit U11 is taken out and is delivered to the exposure apparatus 3, and the wafer W is received from the exposure apparatus 3 and returned to the shelf unit U11.

The controller 10 partially or wholly controls the substrate processing system 1. Details of the controller 10 will be described below.

[Configuration of Liquid Processing Unit]

Figure 5:
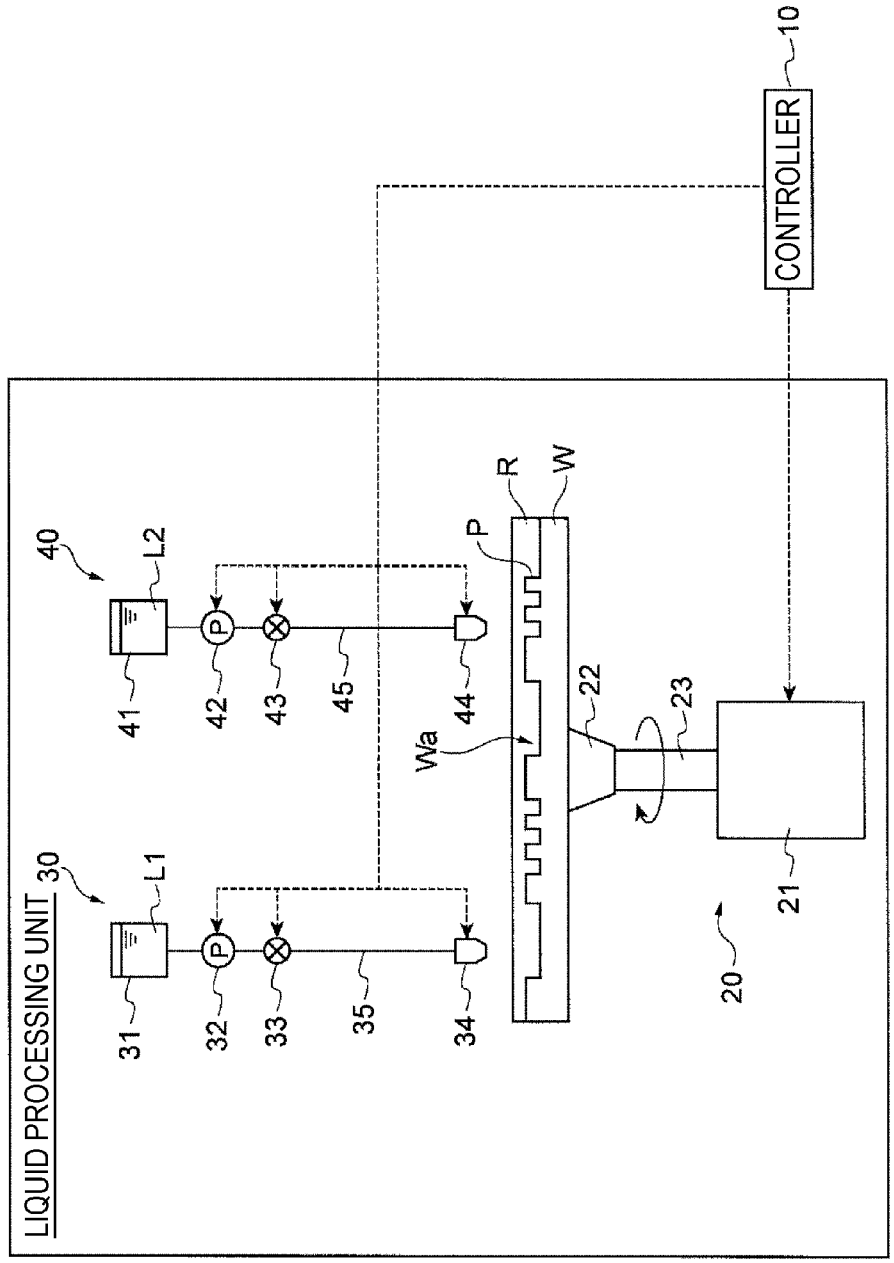
FIG. 5 is a schematic view illustrating a liquid processing unit.

Subsequently, the liquid processing unit U1 will be described in more detail with reference to FIG. 5. The liquid processing unit U1 includes a rotary holding unit 20, a liquid supply unit 30 (a film forming unit, a coating liquid supply unit), and a liquid supply unit 40 (a solvent supply unit).

The rotary holding unit 20 includes a rotation unit 21 and a holding unit 22. The rotation unit 21 includes a shaft 23 protruding upwards. The rotation unit 21 rotates the shaft 23 by using, for example, an electric motor or the like as a power source based on an instruction from the controller 10. The holding unit 22 is provided on a distal end portion of the shaft 23. A wafer W is disposed on the holding unit 22. The holding unit 22 substantially horizontally holds the wafer W by, for example, an attraction or the like based on an instruction from the controller 10. That is, the rotary holding unit 20 rotates the wafer W around an axis (a rotation axis) perpendicular to the front surface Wa of the wafer W in a state where the posture of the wafer W is substantially horizontal. In the present exemplary embodiment, the rotation axis passes through the center of the wafer W taking a circular shape, and thus is also a central axis. In the present exemplary embodiment, as illustrated in FIG. 5, the rotary holding unit 20 rotates the wafer W in the clockwise direction when viewed from the top side.

The liquid supply unit 30 is configured to supply a processing liquid L1 to a processing target surface of the wafer W. In the processing modules 14 to 16, the processing liquids L1 are various types of coating liquids for forming an underlayer film, an intermediate film or a resist film. In this case, the liquid supply unit 30 functions as a coating liquid supply unit. In the processing module 17, the processing liquid L1 is a developer. In this case, the liquid supply unit 30 functions as a developer supply unit. In the present specification, the processing target surface of the wafer W refers to the outermost surface on the front surface Wa side of the wafer W, and is the front surface Wa in the case where, for example, a film is not formed on the front surface Wa of the wafer W, and a surface of, for example, a film in the case where, for example, the film is formed on the front surface Wa of the wafer W.

The liquid supply unit 30 includes a liquid source 31, a pump 32, a valve 33, a nozzle 34, and a pipe 35. The liquid source 31 functions as a supply source of the processing liquid L1. The pump 32 sucks and sends the processing liquid L1 from the liquid source 31 to the nozzle 34 through the pipe 35 and the valve 33 based on an instruction from the controller 10. The valve 33 is opened and closed based on an instruction from the controller 10. The nozzle 34 is disposed above the wafer W such that an ejection port faces the front surface Wa of the wafer W. The nozzle 34 may eject the processing liquid L1 sent from the pump 32 to the processing target surface of the wafer W. The nozzle 34 is configured to be movable in the horizontal direction and the vertical direction by a driving unit (not illustrated). The driving unit moves the nozzle 34 based on an instruction from the controller 10. The pipe 35 is connected to the liquid source 31, the pump 32, the valve 33, and the nozzle 34 in this order from the upstream side.

The liquid supply unit 40 is configured to supply a processing liquid L2 to a processing target surface of the wafer W. In the processing modules 14 to 16, the processing liquids L2 are various types of organic solvents for removing an underlayer film, an intermediate film, or a resist film from the wafer W. In this case, the liquid supply unit 40 functions as a solvent supply unit. In the processing module 17, the processing liquid L2 is a rinsing liquid. In this case, the liquid supply unit 40 functions as a rinsing liquid supply unit.

The liquid supply unit 40 includes a liquid source 41, a pump 42, a valve 43, a nozzle 44, and a pipe 45. The liquid source 41 functions as a supply source of the processing liquid L2. The pump 42 sucks and sends the processing liquid L2 from the liquid source 41 to the nozzle 44 through the pipe 45 and the valve 43 based on an instruction from the controller 10. The valve 43 is opened and closed based on an instruction from the controller 10. The nozzle 44 is disposed above the wafer W such that an ejection port faces the front surface Wa of the wafer W. The nozzle 44 may eject the processing liquid L2 sent from the pump 42 to the processing target surface of the wafer W. The nozzle 44 is configured to be movable in the horizontal direction and the vertical direction by a driving unit (not illustrated). The driving unit moves the nozzle 44 based on an instruction from the controller 10. The pipe 45 is connected to the liquid source 41, the pump 42, the valve 43, and the nozzle 44 in this order from the upstream side.

[Configuration of Inspection Unit]

Figure 6:
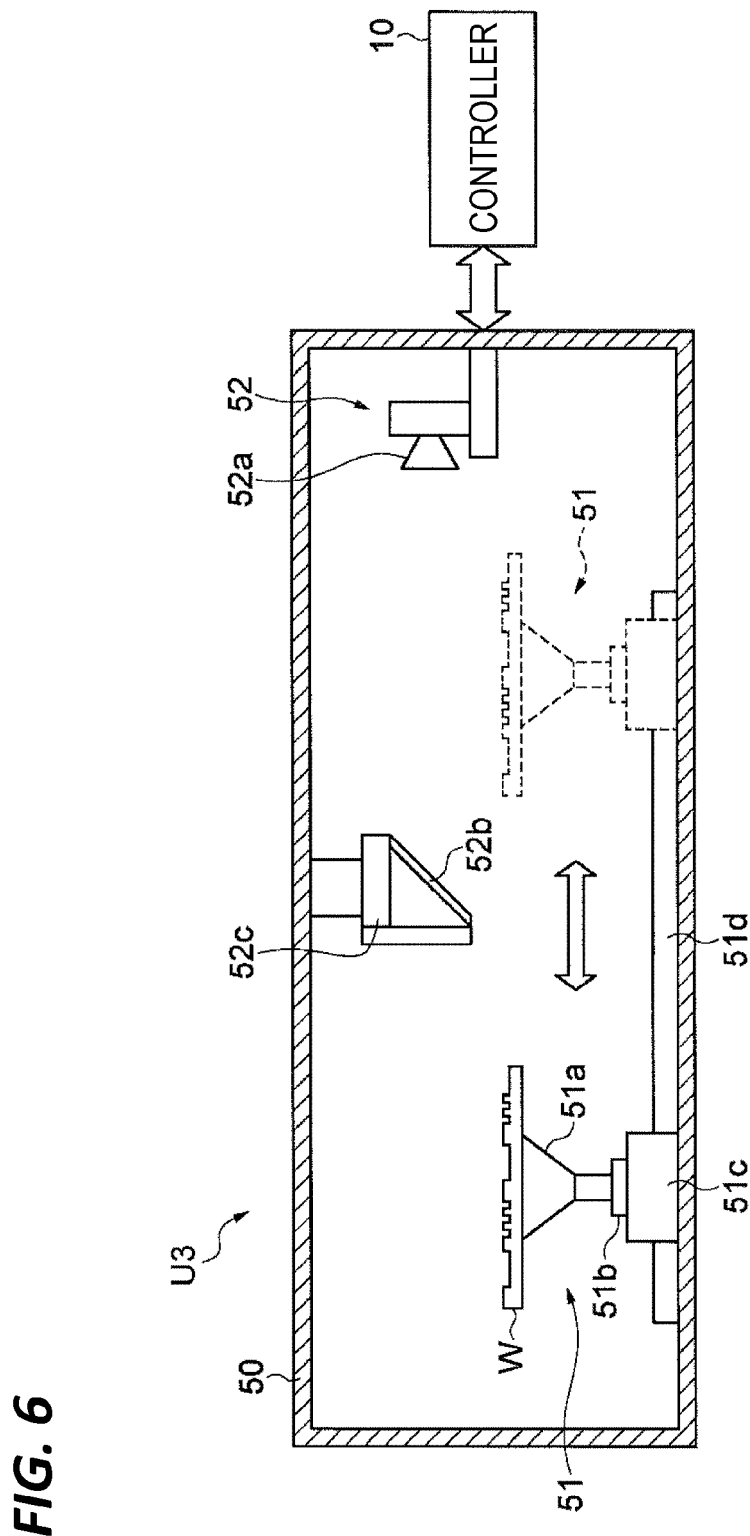
FIG. 6 is a schematic view illustrating an inspection unit.

Subsequently, the inspection unit U3 will be described in more detail with reference to FIG. 6. The inspection unit U3 includes a casing 50, and a holding driving unit 51 and an imaging unit 52 (a state acquisition unit) disposed within the casing 50.

The holding driving unit 51 includes a holding base 51a, actuators 51b and 51c, and a guide rail 51d. The holding base 51a substantially horizontally holds a wafer W by, for example, an attraction or the like. The actuator 51b is, for example, an electric motor, and rotationally drives the holding base 51a. The actuator 51c is, for example, a linear actuator, and moves the holding base 51a along the guide rail 51d. That is, the actuator 51c conveys the wafer W held by the holding base 51a between one end side and the other end side of the guide rail 51d based on an instruction of the controller 10. The guide rail 51d extends linearly (for example, a straight line) within the casing 50.

The imaging unit 52 includes a camera 52a, a half mirror 52b, and a light source 52c. The camera 52a is, for example, a wide angle-type CCD camera. The camera 52a is attached to a side wall of the casing 50. The camera 52a faces the half mirror 52b. The camera 52a captures an image based on an instruction of the controller 10, and transmits data of the capture image to the controller 10.

The half mirror 52b is attached to a ceiling wall of the casing 50 while inclined with respect to a horizontal direction by approximately 45°. The half mirror 52b is located above the middle portion of the guide rail 51d. The light source 52c is located above the half mirror 52b. The light emitted from the light source 52c passes through the half mirror 52b and radiates downwards (the guide rail 51d side). The light that has passed through the half mirror 52b, is reflected by an object present below the half mirror 52b, and further reflected by the half mirror 52b, and then is incident on the camera 52a. That is, the camera 52a may capture the object present in an irradiation area of the light source 52c, through the half mirror 52b. When the wafer W moves along the guide rail 51d by the holding driving unit 51, the imaging unit 52 may capture a processing target surface of the wafer W. That is, the imaging unit 52 acquires a capture image of the processing target surface as a state of the processing target surface of the wafer W. In the controller 10, by processing capture image data, for example, a film thickness of a film present on the processing target surface of the wafer W may also be detected.

[Configuration of Polishing Unit]

Figure 7:
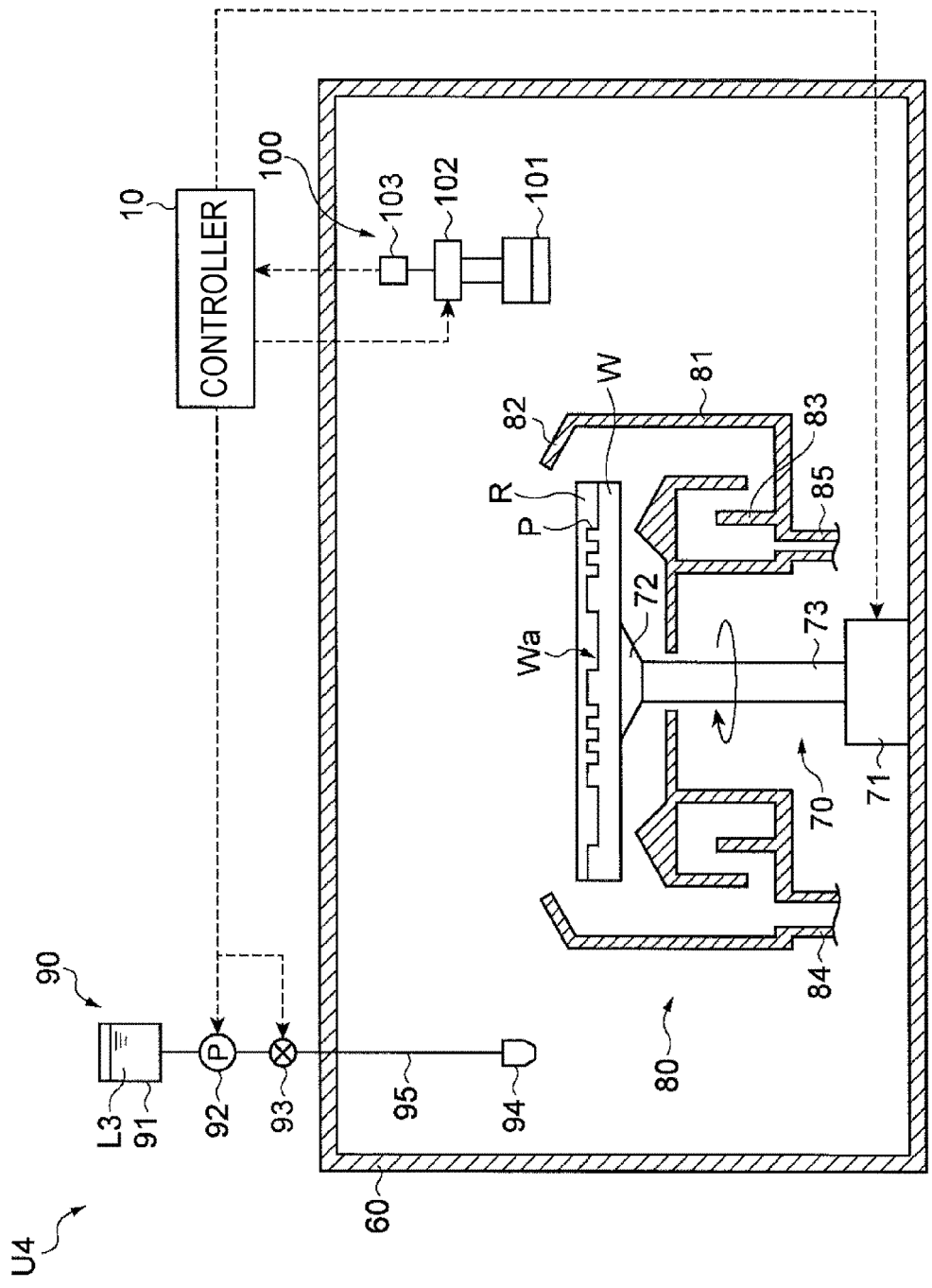
FIG. 7 is a schematic view illustrating a polishing unit.

Subsequently, the polishing unit U4 will be described in more detail with reference to FIG. 7. The polishing unit U4 includes a casing 60, and a rotary holding unit 70, a cup 80, a liquid supply unit 90 (an additive liquid supply unit) and a polishing unit 100 disposed within the casing 60.

The rotary holding unit 70 includes a rotation unit 71 and a holding unit 72. The rotation unit 71 includes a shaft 73 protruding upwards. The rotation unit 71 rotates the shaft 73 by using, for example, an electric motor or the like as a power source based on an instruction from the controller 10. The holding unit 72 is provided on a distal end portion of the shaft 73. A wafer W is disposed on the holding unit 72. The holding unit 72 substantially horizontally holds the wafer W by, for example, an attraction or the like based on an instruction from the controller 10. That is, the rotary holding unit 70 rotates the wafer W around an axis (a rotation axis) perpendicular to the front surface Wa of the wafer W in a state where the posture of the wafer W is substantially horizontal. In the present exemplary embodiment, the rotation axis passes through the center of the wafer W taking a circular shape, and thus is also a central axis. In the present exemplary embodiment, as illustrated in FIG. 7, the rotary holding unit 70 rotates the wafer W in the clockwise direction when viewed from the top side.

The cup 80 is provided around the rotary holding unit 70. When the wafer W rotates, an additive liquid supplied from the liquid supply unit 90 to the front surface of the wafer W is shaken off and falls to surroundings. The cup 80 is configured to receive the falling additive liquid. The cup 80 includes a liquid receiving portion 81 and an inclined portion 82. The liquid receiving portion 81 has a bottomed cylindrical shape. A partition wall 83 is provided inside the liquid receiving portion 81, and the interior of the liquid receiving portion 81 is partitioned into an outer region and an inner region by the partition wall 83. A drainage pipe 84 that discharges a liquid is provided in a portion of a bottom wall of the liquid receiving portion 81 corresponding to the outer region. An exhaust pipe 85 that exhausts a processing atmosphere is provided in a portion of the bottom wall of the liquid receiving portion 81 corresponding to the inner region. The inclined portion 82 is integrally provided on the upper end of the liquid receiving portion 81.

The liquid supply unit 90 is configured to supply an additive liquid L3 to a processing target surface of the wafer W. The additive liquid L3 is, for example, pure water.

The liquid supply unit 90 includes a liquid source 91, a pump 92, a valve 93, a nozzle 94, and a pipe 95. The liquid source 91 functions as a supply source of the additive liquid L3. The pump 92 sucks and sends the additive liquid L3 from the liquid source 91 to the nozzle 94 through the pipe 95 and the valve 93 based on an instruction from the controller 10. The valve 93 is opened and closed based on an instruction from the controller 10. The nozzle 94 is disposed above the wafer W such that an ejection port faces the front surface Wa of the wafer W. The nozzle 94 may eject the additive liquid L3 sent from the pump 92 to the processing target surface of the wafer W. The nozzle 94 is configured to be movable in the horizontal direction and the vertical direction by a driving unit (not illustrated). The driving unit moves the nozzle 94 based on an instruction from the controller 10. The pipe 95 is connected to the liquid source 91, the pump 92, the valve 93, and the nozzle 94 in this order from the upstream side.

The polishing unit 100 includes a polishing member 101, an actuator 102 (a driving unit), and a sensor 103 (a state acquisition unit). The polishing member 101 is configured to come in contact with the processing target surface of the wafer W to polish the processing target surface of the wafer W. The polishing member 101 may have a substantially cylindrical shape. The diameter of the polishing member 101 is, for example, about 65 mm, and the lower surface thereof is flat. The polishing member 101 may be made of a resin, and may also be made of, for example, polyvinyl alcohol (PVA) or polyethylene. The polishing member 101 may be a porous body.

The polyvinyl alcohol is excellent in a water absorption. The polyvinyl alcohol is high in a frictional resistance as compared to, for example, polyurethane or a suede leather, and thus is excellent in a polishing ability. The polyvinyl alcohol is composed of carbon, hydrogen, and oxygen, and has a similar composition to, for example, that of constituent components of the above described SOC film. The hardness of the polyvinyl alcohol is relatively low.

The polyethylene is inferior in a water absorption to the polyvinyl alcohol, but by wetting with the additive liquid L3, a frictional resistance and an adhesion to the wafer W are enhanced. The polyethylene is composed of carbon, hydrogen, and oxygen, and has a similar composition to, for example, that of constituent components of the above described SOC film. In the case where the polishing member 101 is made of polyethylene, even when the amount of the additive liquid L3 is large, a sufficient polishing ability may be achieved. The polyethylene may be, for example, high density polyethylene with a density of 0.942 or more. The hardness of the high density polyethylene is relatively high. Thus, the high density polyethylene is excellent in a polishing ability.

The actuator 102 drives the polishing member 101 such that the polishing member 101 moves along the processing target surface of the wafer W held by the rotary holding unit 70. The actuator 102 moves the polishing member 101 in the horizontal direction and the vertical direction based on an instruction from the controller 10. The actuator 102 rotationally drives the polishing member 101 based on an instruction from the controller 10. The actuator 102 may drive the rotary holding unit 70 such that the polishing member 101 moves along the processing target surface of the wafer W held by the rotary holding unit 70. That is, the actuator 102 may relatively move the polishing member 101 with respect to the processing target surface of the wafer W held by the rotary holding unit 70.

The sensor 103 is configured to acquire a physical quantity that changes according to the progress of polishing on the processing target surface of the wafer W. The sensor 103 is configured to be able to acquire, for example, the number of rotations of the polishing member 101 by the actuator 102, the amount of a current flowing through the actuator 102 when the actuator 102 rotationally drives the polishing member 101, the vibration frequency of the polishing member 101, the frequency of a fricative sound occurring between the polishing member 101 and the processing target surface of the wafer W when the processing target surface of the wafer W is polished by the polishing member 101, the volume of the fricative sound, or the like. The sensor 103 may be configured to be able to acquire the vibration frequency of the rotary holding unit 70. Data of the physical quantity acquired by the sensor 103 is output to the controller 10.

[Configuration of Controller]

Figure 8:
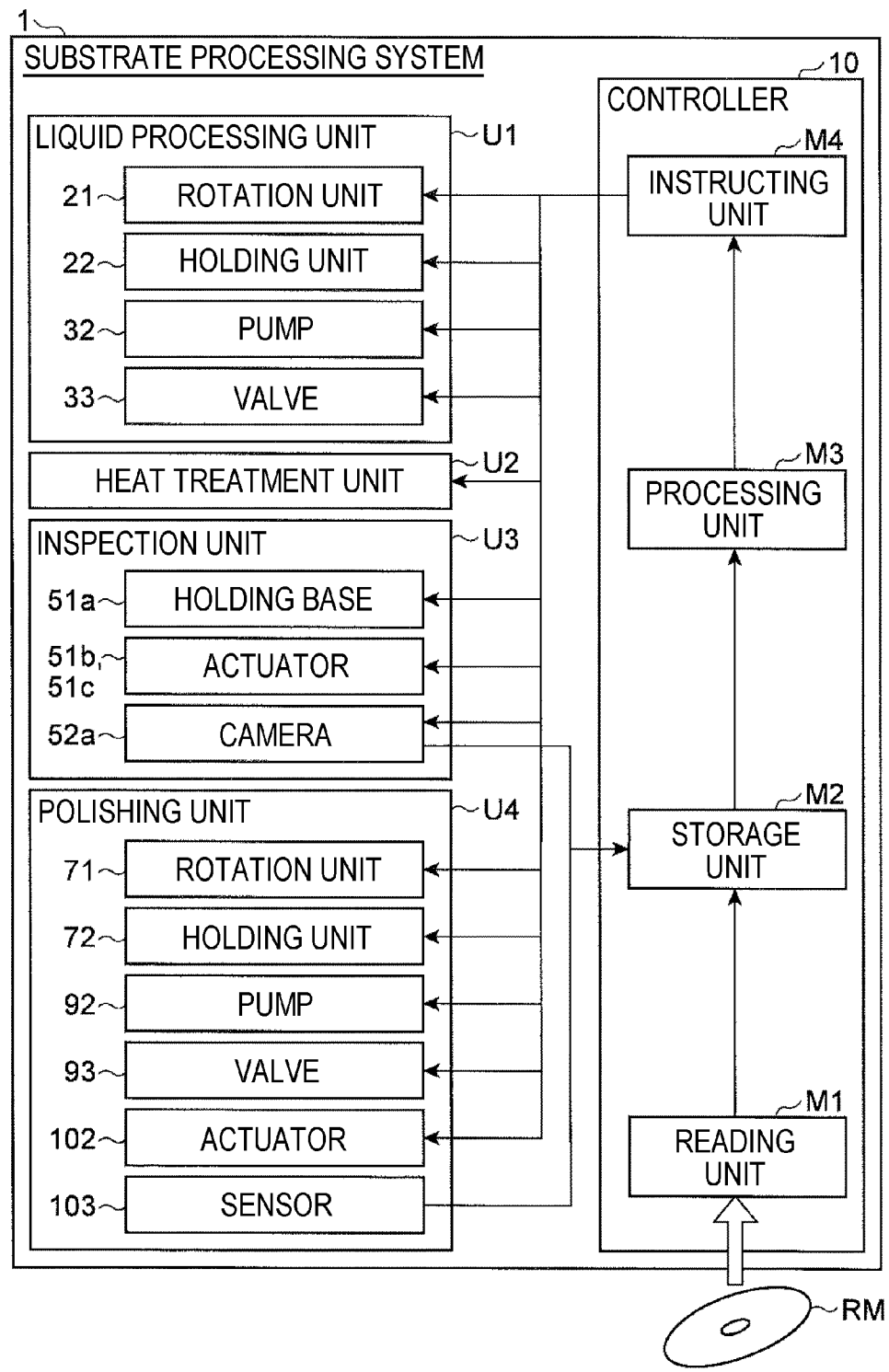
FIG. 8 is a block diagram illustrating a main portion of the substrate processing system.

The controller 10, as illustrated in FIG. 8, includes, as function modules, a reading unit M1, a storage unit M2, a processing unit M3, and an instructing unit M4. These function modules are merely a plurality of modules obtained by dividing a function of the controller 10 for the sake of convenience, and do not necessarily indicate that hardware constituting the controller 10 is divided into such modules. Each function module is not limited to one realized by execution of a program, but may be one realized by a dedicated electric circuit (for example, a logic circuit) or an integrated circuit (ASIC: Application Specific Integrated Circuit) in which this is integrated.

The reading unit M1 reads a program from a computer-readable recording medium RM. In the recording medium RM, a program that operates each unit of the substrate processing system 1 is recorded. The recording medium RM may be, for example, a semiconductor memory, an optical recording disk, a magnetic recording disk, or a magneto-optical recording disk.

The storage unit M2 stores various data. The storage unit M2 stores, for example, not only a program read by the reading unit M1 from the recording medium RM, data of a capture image captured by the camera 52a, and data of a physical quantity acquired by the sensor 103, but also various types of data (a so-called processing recipe) at the time of a processing on a wafer W, setting data input from an operator through an external input device (not illustrated) or the like.

The processing unit M3 processes various types of data. The processing unit M3, based on, for example, the various types of data stored in the storage unit M2, generates operation signals for operating the liquid processing unit U1 (for example, the rotation unit 21, the holding unit 22, the pump 32, the valve 33 and the like), the heat treatment unit U2, the inspection unit U3 (for example the holding base 51a, the actuators 51b and 51c, the camera 52a, and the like) and the polishing unit U4 (for example, the rotation unit 71, the holding unit 72, the pump 92, the valve 93, the actuator 102 and the like). The processing unit M3 sets or changes conditions of polishing by the polishing member 101 on a processing target surface of the wafer W based on the data of the capture image captured by the camera 52a. The processing unit M3 sets or changes conditions of polishing by the polishing member 101 on the processing target surface of the wafer W based on the data of the physical quantity acquired by the sensor 103.

The instructing unit M4 transmits the operation signals generated by the processing unit M3 to various types of devices.

Figure 9:
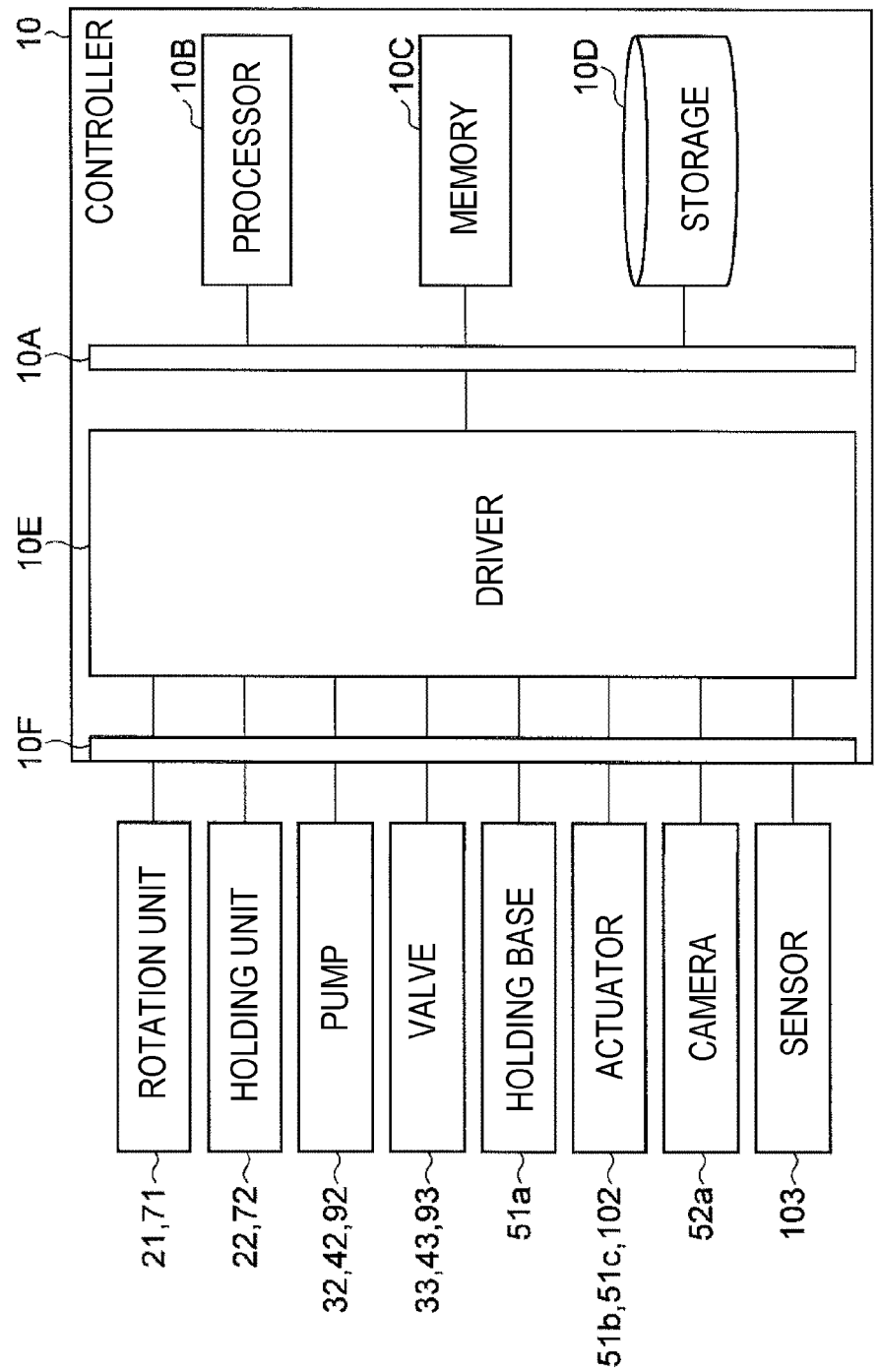
FIG. 9 is a schematic view illustrating a hardware configuration of a controller.

The hardware of the controller 10 is constituted by, for example, one or a plurality of control computers. The controller 10 includes, as a configuration on the hardware, for example, a circuit 10A illustrated in FIG. 9. The circuit 10A may be composed of electric circuit elements (a circuitry). The circuit 10A specifically includes a processor 10B, a memory 10C (a storage), a storage 10D (a storage), a driver 10E, and an input/output port 10F. The processor 10B executes a program in cooperation with at least one of the memory 10C and the storage 10D and executes input/output of signals through the input/output port 10F, thereby configuring each of the above described function modules. The memory 10C and the storage 10D function as the storage unit M2. The driver 10E is a circuit that drives each of various types of devices of the substrate processing system 1. The input/output port 10F performs input/output of signals between the driver 10E and various types of devices of the substrate processing system 1 (for example, the rotation units 21 and 71, the holding units 22 and 72, the pumps 32, 42, and 92, the valves 33, 43, and 93, the holding base 51a, the actuators 51b, 51c, and 102, the camera 52a, the sensor 103 and the like).

In the present exemplary embodiment, the substrate processing system 1 includes one controller 10, but may include a controller group (a controller) constituted by a plurality of controllers 10. When the substrate processing system 1 includes the controller group, each of the function modules may be realized by one controller 10, or realized by a combination of two or more controllers 10. When the controller 10 is constituted by a plurality of computers (the circuit 10A), each of the function modules may be realized by one computer (the circuit 10A), or realized by a combination of two or more computers (the circuit 10A). The controller 10 may include a plurality of processors 10B. In this case, each of the function modules may be realized by one processor 10B, or realized by a combination of two or more processors 10B.

[Wafer Processing Method]

Subsequently, a processing method of a wafer W (a substrate processing method) will be described with reference to FIG. 10. Hereinafter, descriptions will be made on a processing in the processing module 15 in the case where an SOC film is formed on a front surface Wa of a wafer W having an uneven pattern P, but the wafer W may be processed in the same manner in the case of other films as well. As for other films, for example, a spin on glass (SOG) film, a resist film, a coating film of a block copolymer used for a self-organizing lithography technology and the like may be exemplified.

First, the controller 10 (the instructing unit M4) controls each unit of the substrate processing system 1 to convey the wafer W having the uneven pattern P (see FIG. 11A) to the inspection unit U3. Then, the controller 10 (the instructing unit M4) controls the holding driving unit 51 so that the wafer W is conveyed from one end side to the other end side of the guide rail 51d while being held by the holding base 51a. Here, at the same time, the controller 10 (the instructing unit M4) controls the imaging unit 52 to capture the front surface Wa of the wafer W (see step S11 in FIG. 10). Data of a capture image captured by the camera 52a is stored in the storage unit M2 of the controller 10. In this manner, an initial state of a processing target surface of the wafer W (a state of the front surface Wa of the wafer W in which a semi-solidified film R to be described below is not present) is acquired (first processing; first process).

Subsequently, the controller 10 (the instructing unit M4) controls each unit of the substrate processing system 1 to convey the wafer W from the inspection unit U3 to the liquid processing unit U1. Then, the controller 10 (the instructing unit M4) controls the rotary holding unit 20 so as to hold the wafer W by the holding unit 22 and to rotate the wafer W by the rotation unit 21 at a predetermined number of rotations. In this state, the controller 10 controls the pump 32, the valve 33, and the nozzle 34 (more specifically, a driving unit that drives the nozzle 34) to eject the processing liquid L1 (a resist liquid) to the front surface Wa of the wafer W from the nozzle 34, and to form a coating film in an unsolidified state (an unsolidified film) on the front surface Wa of the wafer W. Then, the wafer W is left until a solvent included in the unsolidified film is volatilized, and the unsolidified film becomes the semi-solidified film R (see step S12 in FIG. 10, and FIG. 11B; the second processing; second process). Here, the controller 10 (the instructing unit M4) may control each unit of the substrate processing system 1 to convey the wafer W from the liquid processing unit U1 to the heat treatment unit U2, and to heat the wafer W in the heat treatment unit U2 so that the unsolidified film may become the semi-solidified film. The hardness of the semi-solidified film R is lower than the hardness of the polishing member 101.

Subsequently, the controller 10 (the instructing unit M4) controls each unit of the substrate processing system 1 to convey the wafer W to the polishing unit U4. Then, the controller 10 (the instructing unit M4) controls the rotary holding unit 70 to hold the wafer W by the holding unit 72 and to rotate the wafer W by the rotation unit 71 at a predetermined number of rotations. The controller 10 (the instructing unit M4) controls the liquid supply unit 90 to supply the additive liquid L3 to the processing target surface of the wafer (the surface of the semi-solidified film R). Accordingly, while the wafer W is rotated, a state is made in which the processing target surface of the wafer W is wet with the additive liquid L3. In this state, the controller 10 (the instructing unit M4) controls the polishing unit 100 to move the polishing member 101 with respect to the processing target surface of the wafer W based on initial polishing conditions in a state where the polishing member 101 is in contact with the processing target surface of the wafer W, and to polish the processing target surface of the wafer W by the polishing member 101 (see step S13 in FIG. 10; the third processing; third process).

Here, as for the polishing conditions, for example, (1) a pressure at which the polishing member 101 presses the processing target surface of the wafer W, (2) the number of rotations of the polishing member 101, (3) the number of rotations of the wafer W, (4) a time during which the processing target surface of the wafer W is polished by the polishing member 101, (5) the hardness of the polishing member 101, (6) the flow rate of the additive liquid L3 and the like may be exemplified. Regarding the polishing condition 1, when the pressure is higher, the polishing on the processing target surface of the wafer W by the polishing member 101 is promoted. Regarding the polishing conditions 2 and 3, when the number of rotations is higher, the polishing on the processing target surface of the wafer W by the polishing member 101 is promoted. Regarding the polishing condition 4, when the polishing time is longer, the polishing on the processing target surface of the wafer W is promoted. Regarding the polishing condition 5, when the hardness of the polishing member 101 is higher, the polishing on the processing target surface of the wafer W is promoted. Regarding the polishing condition 6, as the flow rate increases, a water retention amount of the polishing member 101 increases, and thus, the polishing on the processing target surface of the wafer W is promoted. It is desirable that the initial polishing conditions are set as conditions under which a slight insufficiency in polishing is caused because there is no need to perform a processing of forming the semi-solidified film R (details will be described below) again.

Subsequently, the controller 10 (the instructing unit M4) controls each unit of the substrate processing system 1 to convey the wafer W from the polishing unit U4 to the inspection unit U3. Then, the controller 10 (the instructing unit M4) controls the holding driving unit 51 so that the wafer W is conveyed from one end side to the other end side of the guide rail 51d while being held by the holding base 51a. Here, at the same time, the controller 10 (the instructing unit M4) controls the imaging unit 52 to capture the front surface Wa of the wafer W (see step S14 in FIG. 10). Data of a capture image captured by the camera 52a is stored in the storage unit M2 of the controller 10. In this manner, a processed state of the processing target surface of the wafer W (a state of the processing target surface of the wafer W after a polishing processing is performed) is acquired (fourth processing; fourth process).

Figure 12A:
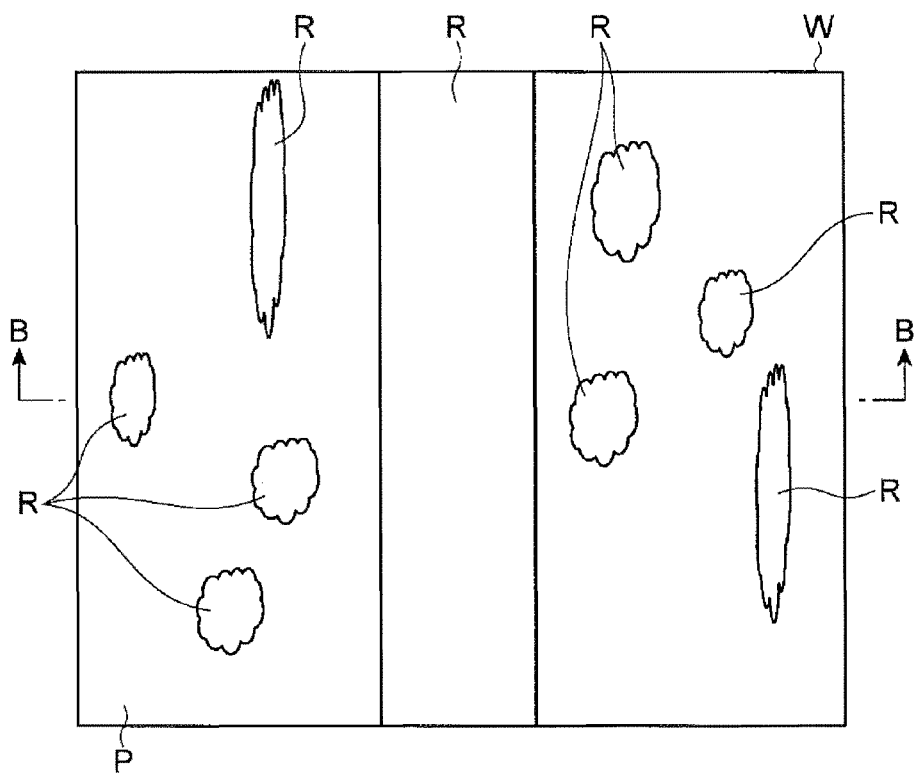
FIG. 12A is a plan view illustrating a part of a processing target surface of a wafer in the case where polishing is insufficient.
Figure 12B:
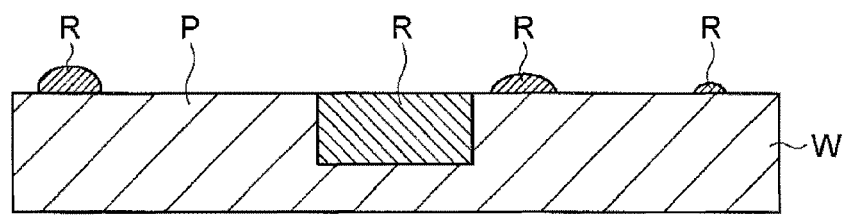
FIG. 12B is a sectional view taken along the line B-B in FIG. 12A.

Subsequently, the controller 10 (the processing unit M3) determines whether the polishing is insufficient, based on the capture image data in the initial state acquired in step S11 and the capture image data in the processed state acquired in step S14 (see step S15 in FIG. 10; fifth processing; fifth process). Here, the insufficiency in polishing indicates a case where the semi-solidified film R remains on the surface of a convex portion in the uneven pattern P of the wafer W, as illustrated in FIGS. 12A and 12B. The controller 10 (the processing unit M3) generates a corrected image by subtracting, for example, a luminance value of each pixel in the capture image data in the processed state from a luminance value of each pixel in the capture image data in the initial state, and determines whether the semi-solidified film R remains on the surface of the convex portion in the uneven pattern P of the wafer W based on, for example, a contrast difference in the corrected image.

Figure 10:
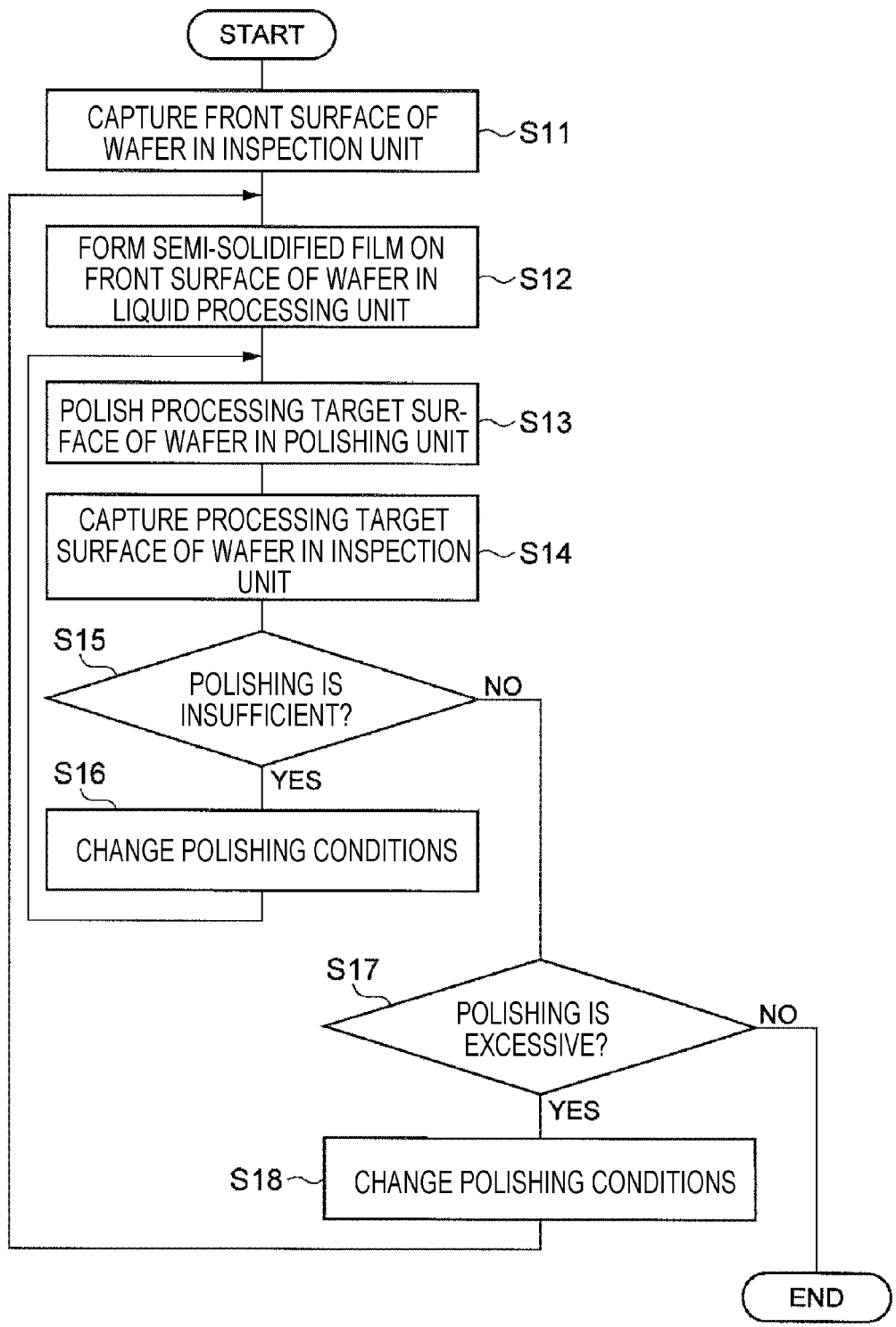
FIG. 10 is a flow chart for explaining an example of a processing procedure of a wafer.
Figure 11A:
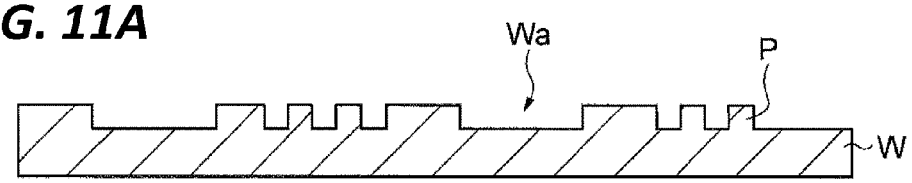
FIGS. 11A to 11C are schematic views for explaining an example of the processing procedure of the wafer.
Figure 11B:
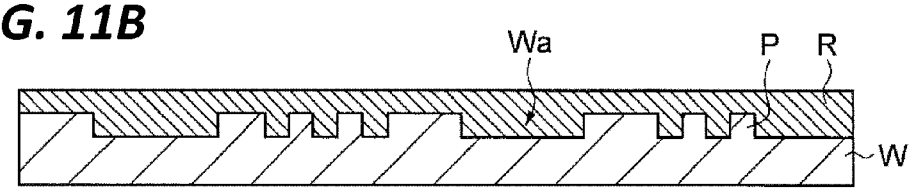

As a result of determination by the controller 10 (the processing unit M3), when the polishing is insufficient (YES in step S15 in FIG. 10), the controller 10 (the processing unit M3) changes polishing conditions into additional polishing conditions different from the initial polishing conditions (step S16 in FIG. 10). Specifically, the controller 10 (the processing unit M3) sets polishing conditions under which the remaining semi-solidified film R is removable, as the additional polishing conditions, based on the size of the remaining semi-solidified film R (for example, an area, a thickness, and the like).

Thereafter, the process returns to step S13, and a processing of the wafer W is performed. Specifically, the controller 10 (the instructing unit M4) controls each unit of the substrate processing system 1 to convey the wafer W from the inspection unit U3 to the polishing unit U4. Then, the controller 10 (the instructing unit M4) controls the rotary holding unit 70 to hold the wafer W by the holding unit 72 and to rotate the wafer W by the rotation unit 71 at a predetermined number of rotations. The controller 10 (the instructing unit M4) controls the liquid supply unit 90 to supply the additive liquid L3 to the processing target surface of the wafer (the surface of the semi-solidified film R). Accordingly, while the wafer W is rotated, a state is made in which the processing target surface of the wafer W is wet with the additive liquid L3. In this state, the controller 10 (the instructing unit M4) controls the polishing unit 100 to move the polishing member 101 with respect to the processing target surface of the wafer W based on the additional polishing conditions in a state where the polishing member 101 is in contact with the processing target surface of the wafer W, and to polish the processing target surface of the wafer W by the polishing member 101 (sixth processing; sixth process). Thereafter, processings from step S14 are sequentially executed.

Figure 13A:
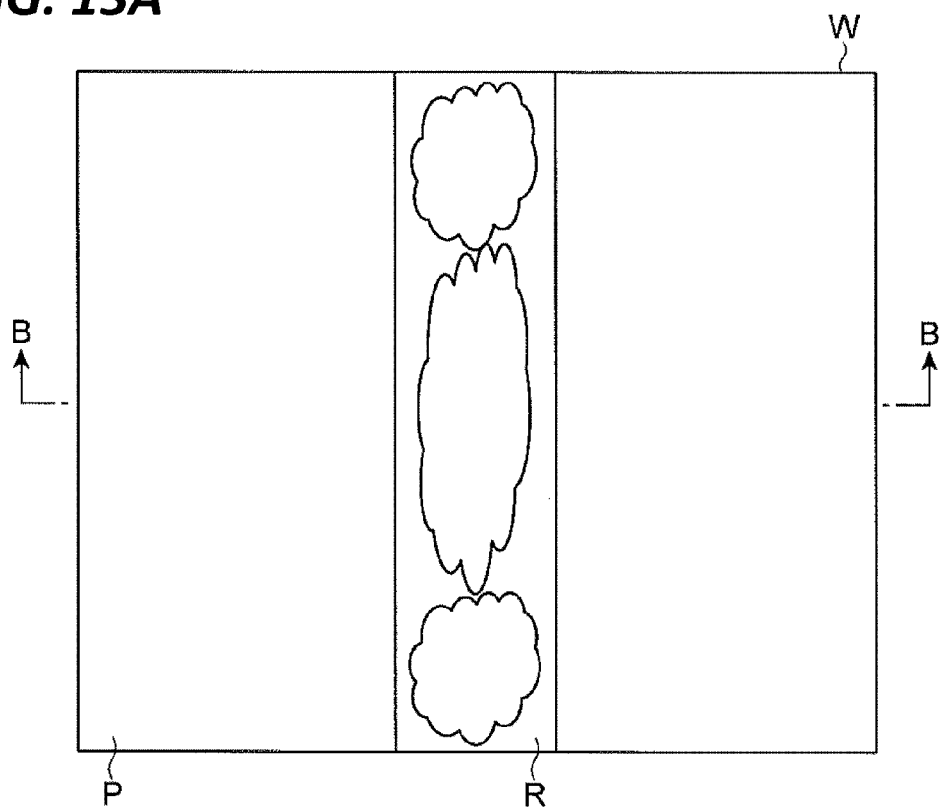
FIG. 13A is a plan view illustrating a part of a processing target surface of a wafer in the case where polishing is excessive.
Figure 13B:
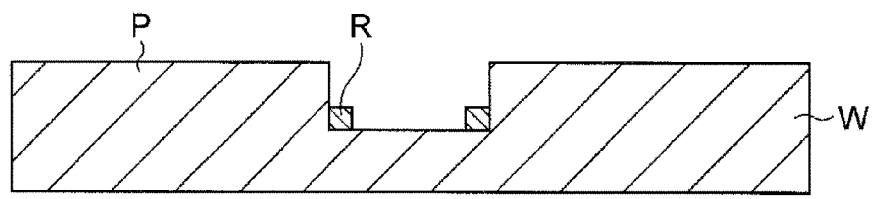
FIG. 13B is a sectional view taken along the line B-B in FIG. 13A.

Meanwhile, as a result of determination by the controller 10 (the processing unit M3), when the polishing is not insufficient (NO in step S15 in FIG. 10), it is determined whether the polishing is excessive, based on the capture image data in the initial state acquired in step S11, and the capture image data in the processed state acquired in step S14 (see step S17 in FIG. 10; fifth processing; fifth process). Here, the excess in polishing indicates a case where a concave portion in the uneven pattern P of the wafer W is not filled with the semi-solidified film R, as illustrated in FIGS. 13A and 13B. The controller 10 (the processing unit M3) generates a corrected image by subtracting, for example, a luminance value of each pixel in the capture image data in the processed state from a luminance value of each pixel in the capture image data in the initial state, and determines whether the concave portion in the uneven pattern P of the wafer W is filled with the semi-solidified film R based on, for example, a contrast difference in the corrected image.

As a result of determination by the controller 10 (the processing unit M3), when the polishing is excessive (YES in step S17 in FIG. 10), the controller 10 (the processing unit M3) changes polishing conditions into re-polishing conditions different from the initial polishing conditions (step S18 in FIG. 10). Specifically, the controller 10 (the processing unit M3) sets polishing conditions under which the processing target surface of the wafer W is difficult to polish as compared to the initial polishing conditions, as the re-polishing conditions.

Thereafter, the process returns to step S12, and a processing of the wafer W is performed. Specifically, each unit of the substrate processing system 1 is controlled to convey the wafer W from the polishing unit U4 to the liquid processing unit U1, and to form the semi-solidified film R on the processing target surface of the wafer W again (seventh processing; seventh process).

Subsequently, the controller 10 (the instructing unit M4) controls each unit of the substrate processing system 1 to convey the wafer W from the liquid processing unit U1 to the polishing unit U4. Then, the controller 10 (the instructing unit M4) controls the rotary holding unit 70 to hold the wafer W by the holding unit 72 and to rotate the wafer W by the rotation unit 71 at a predetermined number of rotations. The controller 10 (the instructing unit M4) controls the liquid supply unit 90 to supply the additive liquid L3 to the processing target surface of the wafer (the surface of the semi-solidified film R). Accordingly, while the wafer W is rotated, a state is made in which the processing target surface of the wafer W is wet with the additive liquid L3. In this state, the controller 10 (the instructing unit M4) controls the polishing unit 100 to move the polishing member 101 with respect to the processing target surface of the wafer W based on the re-polishing conditions in a state where the polishing member 101 is in contact with the processing target surface of the wafer W, and to polish the processing target surface of the wafer W by the polishing member 101 (eighth processing; eighth process). Thereafter, processings from step S14 are sequentially executed.

Figure 11C:
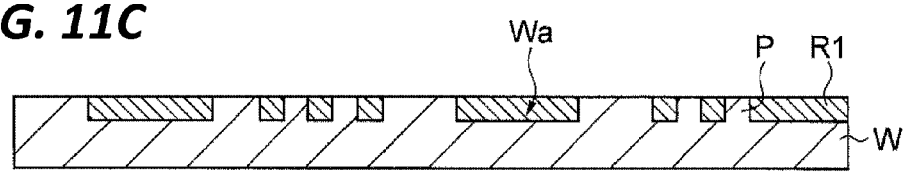

Meanwhile, as a result of determination by the controller 10 (the processing unit M3), when the polishing is not excessive (NO in step S17 in FIG. 10), it is determined that the polishing has been properly performed and the polishing is ended, and the polishing of the wafer W is completed. Thereafter, the controller 10 (the instructing unit M4) controls each unit of the substrate processing system 1 to convey the wafer W from the polishing unit U4 to the heat treatment unit U2, and to heat the wafer W in the heat treatment unit U2. Thus, the semi-solidified film R is solidified to form a SOC film R1 (see FIG. 11C). The hardness of the SOC film R1 is higher than the hardness of the polishing member 101.

[Action]

In the present exemplary embodiment as described above, after the coating film becomes the semi-solidified film R by volatilization of the solvent included in the coating film (unsolidified film), in step S13, the additive liquid L3 is supplied to the processing target surface of the wafer W that rotates, and a state is made in which the polishing member 101 and the processing target surface are wet with the additive liquid L3. Then, in a state where the polishing member 101 is in contact with the processing target surface of the wafer W, based on the initial polishing conditions, the processing target surface of the wafer W is polished by the polishing member 101. Thus, when the semi-solidified film R is polished by the polishing member 101, since a state is made in which the polishing member 101 and the processing target surface of the wafer W are wet with the additive liquid L3, the processing target surface and the uneven pattern P of the wafer W are hardly damaged. Accordingly, the processing target surface of the wafer W is polished without performing a chemical mechanical polishing processing that polishes a cured film by using a polishing liquid in a large amount. As a result, it becomes possible to flatten the processing target surface of the wafer W at a low cost.

In the present exemplary embodiment, in step S11, the initial state of the processing target surface of the wafer W is acquired as capture image data by the camera 52a. In step S14, the processed state of the processing target surface of the wafer W (the surface state of the semi-solidified film R) is acquired as capture image data by the camera 52a. Based on the initial state and the processed state, it is determined whether the polishing is insufficient (step S15) and whether the polishing is excessive (step S17). Thus, the initial state of the processing target surface of the wafer W functions as a reference value by which the end of polishing, the insufficiency in polishing, or the excess in polishing is determined. Therefore, there is no need to process a plurality of sample substrates in advance in order to obtain a reference value and thus, it is possible to immediately obtain the reference value without wasting the sample substrates. The state of the processing target surface of the wafer W is different for each of wafers W. However, since the initial state of the processing target surface is acquired for each of the wafers W, the end of polishing may be highly accurately determined for each of the wafers W. As described above, according to the present exemplary embodiment, it becomes possible to rapidly perform a determination of the end of polishing of the wafer W, for each of the wafers W, at a low cost and a high accuracy.

In the present exemplary embodiment, the uneven pattern P is formed on the front surface Wa of the wafer W, and the processing target surface of the wafer W is the outermost surface of the wafer W on the front surface Wa (uneven surface) side. In this case as well, when the semi-solidified film R is polished by the polishing member 101, since a state is made in which the polishing member 101 and the processing target surface of the wafer W are wet with the additive liquid, a damage may be suppressed from occurring in the uneven pattern P of the wafer W.

In the present exemplary embodiment, the polishing member 101 is made of, for example, polyvinyl alcohol or is made of polyethylene. Thus, the semi-solidified film R in a soft state to some extent before the coating film is completely hardened is polished by the polishing member made of polyvinyl alcohol or polyethylene. Accordingly, a damage may be further suppressed from occurring in the uneven pattern P of the wafer W.

In the present exemplary embodiment, as a result of determination in step S15, when the polishing is insufficient in the processing target surface of the wafer W (YES in step S15), the process returns to step S13 and polishing of the wafer W is performed based on the additional polishing conditions. Thus, it becomes possible to more accurately flatten the processing target surface of the wafer W.

In the present exemplary embodiment, as a result of determination in step S17, when the polishing is excessive in the processing target surface of the wafer W (YES in step S17), the process returns to step S12 and the semi-solidified film R is formed on the wafer W, and then polishing of the wafer W is performed based on the re-polishing conditions in step S13. Thus, it becomes possible to more accurately flatten the processing target surface of the wafer W.

In the present exemplary embodiment, the polishing member 101 is a porous body. Thus, since the water absorption of the polishing member 101 increases, the additive liquid L3 is absorbed by the polishing member 101 in step S13. Therefore, as the additive liquid L3 soaking into the polishing member 101 seeps into the processing target surface of the wafer W, the processing target surface of the wafer W is polished by the polishing member 101. As a result, at the time of polishing by the polishing member 101, a damage may be further suppressed from occurring in the uneven pattern of the wafer W.

Other Exemplary Embodiments

Figure 14:
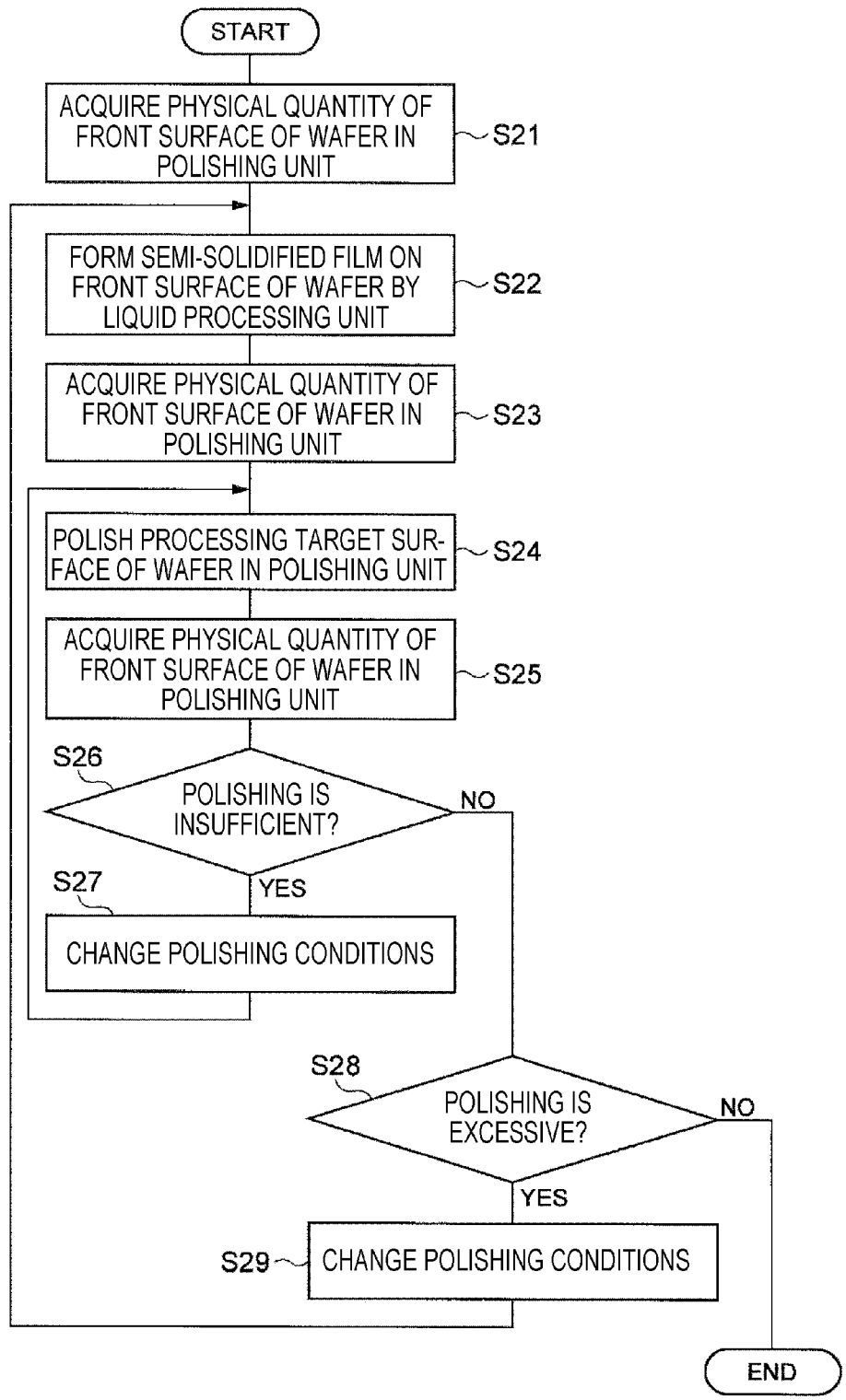
FIG. 14 is a flow chart for explaining another example of the processing procedure of the wafer.

As described above, the exemplary embodiment according to the present disclosure has been described in detail, but various modifications may be added to the above described exemplary embodiment within the scope of the gist of the present invention. For example, the completion of polishing on the processing target surface of the wafer W may be determined based on data of a physical quantity acquired by the sensor 103 instead of capture image data acquired by the camera 52a. Specifically, the wafer W may be processed in the procedure as illustrated in FIG. 14.

First, the controller 10 (the instructing unit M4) controls each unit of the substrate processing system 1 to convey a wafer W having an uneven pattern P (see FIG. 11A) to the polishing unit U4. Then, the controller 10 (the instructing unit M4) controls the polishing unit 100 to acquire data of a physical quantity of the front surface Wa of the wafer W by the sensor 103 (see step S21 in FIG. 14). In this manner, an initial state of a processing target surface of the wafer W (a state of the front surface Wa of the wafer W in which a semi-solidified film R is not present) is acquired.

Subsequently, the controller 10 (the instructing unit M4) controls each unit of the substrate processing system 1 to convey the wafer W from the polishing unit U4 to the liquid processing unit U1 and to form the semi-solidified film R on the wafer W like in step S12 (see step S22 in FIG. 14).

Subsequently, the controller 10 (the instructing unit M4) controls each unit of the substrate processing system 1 to convey the wafer W from the liquid processing unit U1 to the polishing unit U4. Then, the controller 10 (the instructing unit M4) controls the polishing unit 100 to acquire data of a physical quantity of the processing target surface of the wafer W by the sensor 103 (see step S23 in FIG. 14). In this manner, an intermediate state of the processing target surface of the wafer W (a state of the surface of the semi-solidified film R) is acquired (ninth processing; ninth process).

Subsequently, the controller 10 (the instructing unit M4) controls the polishing unit 100 to convey the wafer W from the polishing unit U4 to the liquid processing unit U1 and to polish the processing target surface of the wafer W by the polishing member 101 based on initial polishing conditions like in step S13 (see step S24 in FIG. 14).

Subsequently, the controller 10 (the instructing unit M4) controls the polishing unit 100 to acquire data of a physical quantity of the processing target surface of the wafer W by the sensor 103 (see step S25 in FIG. 14). In this manner, a processed state of the processing target surface of the wafer W (a state of the processing target surface of the wafer W after a polishing processing is performed) is acquired.

Subsequently, the controller 10 (the processing unit M3) determines whether the polishing is insufficient based on the data of the physical quantity in the initial state acquired in step S21, the data of the physical quantity in the intermediate state acquired in step S23, and the data of the physical quantity in the processed state acquired in step S25 (see step S26 in FIG. 14).

As a result of determination by the controller 10 (the processing unit M3), when the polishing is insufficient (YES in step S26 in FIG. 14), the controller 10 (the processing unit M3) changes polishing conditions into additional polishing conditions different from the initial polishing conditions like in step S16 (step S27 in FIG. 14). Then, the process returns to step S13 and a processing of the wafer W is performed based on the additional polishing conditions. Thereafter, processings from step S14 are sequentially executed.

Meanwhile, as a result of determination by the controller 10 (the processing unit M3), when the polishing is not insufficient (NO in step S26 in FIG. 14), it is determined whether the polishing is excessive, based on the data of the physical quantity in the initial state acquired in step S21, the data of the physical quantity in the intermediate state acquired in step S23, and the data of the physical quantity in the processed state acquired in step S25 (see step S28 in FIG. 14).

As a result of determination by the controller 10 (the processing unit M3), when the polishing is excessive (YES in step S28 of FIG. 14), the controller 10 (the processing unit M3) changes polishing conditions into re-polishing conditions different from the initial polishing conditions (step S29 in FIG. 14). Then, the process returns to step S12 and the semi-solidified film R is formed on the processing target surface of the wafer W again, and a processing of the wafer W is performed based on the re-polishing conditions in step S13. Thereafter, processings from step S14 are sequentially executed.

Meanwhile, as a result of determination by the controller 10 (the processing unit M3), when the polishing is not excessive (NO in step S28 of FIG. 14), it is determined that the polishing has been properly performed and the polishing is ended, and the polishing of the wafer W is completed. In this case as well, the end of polishing, the insufficiency in polishing, or the excess in polishing may be more accurately determined based on three states (the initial state, the intermediate state, and the processed state).

Here, descriptions will be made on a case where the physical quantity acquired by the sensor 103 is the number of rotations of the polishing member 101. In step S21, the polishing member 101 mainly comes in contact with the uneven pattern P of the wafer W which has a relatively high hardness. Thus, since a frictional resistance between the polishing member 101 and the processing target surface of the wafer W becomes relatively large, a time T1 until the number of rotations of the polishing member 101 reaches a predetermined number becomes long. In step S23, the polishing member 101 mainly comes in contact with the semi-solidified film R which has a relatively low hardness. Thus, since a frictional resistance between the polishing member 101 and the processing target surface of the wafer W becomes relatively small, a time T2 until the number of rotations of the polishing member 101 reaches a predetermined number becomes short. Accordingly, in step S25, a time T3 until the number of rotations of the polishing member 101 reaches a predetermined number is acquired and is compared to the times T1 and T2, so as to determine the insufficiency in polishing, the excess in polishing, or the end of polishing. For example, when the time T1 is equal to or longer than the time T3 (T1≥T3) and the time T2 is approximately equal to the time T3 (T2=T3), since a relatively large amount of semi-solidified film R remains on the processing target surface of the wafer W, it may be determined that the polishing is insufficient. When the time T1 is approximately equal to the time T3 (T1=T3), since the semi-solidified film R hardly remains on the processing target surface of the wafer W, it may be determined that the polishing is excessive. Meanwhile, when there is neither insufficiency in polishing nor excess in polishing, it may be determined that the polishing is ended.

Descriptions will be made on a case where the physical quantity acquired by the sensor 103 is a current value of the actuator 102 that rotates the polishing member 101. In step S21, the polishing member 101 mainly comes in contact with the uneven pattern P of the wafer W which has a relatively high hardness. Thus, since a frictional resistance between the polishing member 101 and the processing target surface of the wafer W becomes relatively large, a current value I1 increases in order to rotate the polishing member 101. In step S23, the polishing member 101 mainly comes in contact with the semi-solidified film R which has a relatively low hardness. Thus, since a frictional resistance between the polishing member 101 and the processing target surface of the wafer W becomes relatively small, a current value I2 that rotates the polishing member 101 decreases. Accordingly, in step S25, a current value I3 of the actuator 102 that rotates the polishing member 101 is acquired and is compared to the current values I1 and I2 so as to determine the insufficiency in polishing, the excess in polishing, or the end of polishing. For example, when the current value I1 is equal to or larger than the current value I3 (I1≥I3) and the current value I2 is approximately equal to the current value I3 (I2=I3), since a relatively large amount of semi-solidified film R remains on the processing target surface of the wafer W, it may be determined that the polishing is insufficient. When the current value I1 is approximately equal to the current value I3 (I1=I3), since the semi-solidified film R hardly remains on the processing target surface of the wafer W, it may be determined that the polishing is excessive. Meanwhile, when there is no insufficiency in polishing nor excess in polishing, it may be determined that the polishing is ended.

When it is determined by the controller 10 (the processing unit M3) that the polishing is insufficient or the polishing is excessive, a subsequent wafer W may be polished by the polishing member 101 based on new initial polishing conditions different from the initial polishing conditions. Specifically, when the polishing on the current wafer W is insufficient, polishing conditions under which the processing target surface of the subsequent wafer W is easy to polish as compared to the initial polishing conditions, are set as the new initial polishing conditions. When the polishing on the current wafer W is excessive, polishing conditions under which the processing target surface of the subsequent wafer W is difficult to polish as compared to the initial polishing conditions are set as the new initial polishing conditions. In this case, it becomes possible to more accurately flatten the processing target surface of the subsequent wafer W.

In the above described exemplary embodiments, the front surface Wa of the wafer W on which the semi-solidified film R is formed is polished by the polishing member 101 made of a resin. However, a film to be polished is not limited to the coating film, but may be various types of thin films formed through, for example, CVD, PVD, ALD or the like. A material of the polishing member 101 is not particularly limited as long as the material may polish the processing target surface of the wafer W through contact with the wafer W. Thus, the processing target surface of the wafer W may be polished by a chemical mechanical polishing processing.

In the above described exemplary embodiments, the processing target surface of the wafer W having the front surface Wa formed with the uneven pattern P is polished, but a wafer W not having an uneven pattern P, that is, the processing target surface of the wafer W having a substantially flat front surface Wa may be polished.

DESCRIPTION OF SYMBOLS

1: substrate processing system (substrate processing apparatus)
2: coating and developing apparatus (substrate processing apparatus)
10: controller (controller)
30: liquid supply unit (film forming unit, coating liquid supply unit)
52: imaging unit (state acquisition unit)
52a: camera
70: rotary holding unit
90: liquid supply unit (additive liquid supply unit)
100: polishing unit
101: polishing member
102: actuator (driving unit)
103: sensor (state acquisition unit)
L1: processing liquid (coating liquid)
L3: additive liquid P: uneven pattern
R: semi-solidified film R1: SOC film
RM: recording medium
U1: liquid processing unit (substrate processing apparatus)
U3: inspection unit (substrate processing apparatus)
U4: polishing unit (substrate processing apparatus)
W: wafer (substrate)
Wa: front surface (uneven surface)

What is claimed is:

1. A substrate processing method comprising:
first acquiring first capture image data of an initial state of a processing target surface of a substrate with a camera;
first forming a film on the substrate by rotating the substrate and supplying a coating liquid to the processing target surface of the substrate after the first acquiring;
first polishing the processing target surface of the substrate by a polisher based on initial polishing conditions in a state where the polisher is in contact with the processing target surface of the substrate;
second acquiring second capture image data of a processed state of the processing target surface of the substrate with the camera after the polishing by the polisher; and
determining an insufficiency in polishing or an excess in polishing by generating a corrected image by subtracting a second luminance value of each pixel of the second capture image data from a first luminance value of each pixel of the first capture image data,
wherein when determined in the determining that the processing target surface of the substrate is insufficiently polished or excessively polished, in a processing of another subsequent substrate, a processing target surface of the another substrate is polished in the first polishing by the polisher based on new initial polishing conditions different from the initial polishing conditions, and
in the first polishing, after a solvent included in the film is volatilized and the film becomes a semi-solidified film, an additive liquid is supplied to the processing target surface of the substrate that rotates to make a state where the polisher and the processing target surface of the substrate are wet with the additive liquid, and the processing target surface of the substrate is polished by the polisher based on the initial polishing conditions in a state where the polisher is in contact with the processing target surface of the substrate.

* * * * *